United States Patent
Yamazaki et al.

(10) Patent No.: US 7,288,789 B2
(45) Date of Patent: Oct. 30, 2007

(54) SEMICONDUCTOR DEVICE HAVING THIN FILM TRANSISTOR AND LIGHT-SHIELDING FILM

(75) Inventors: Shunpei Yamazaki, Tokyo (JP); Yukio Tanaka, Tokyo (JP); Jun Koyama, Kanagawa (JP); Mitsuaki Osame, Kanagawa (JP); Satoshi Murakami, Tochigi (JP); Hideto Ohnuma, Kanagawa (JP); Etsuko Fujimoto, Kanagawa (JP); Hidehito Kitakado, Hyogo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/446,187

(22) Filed: May 28, 2003

(65) Prior Publication Data

US 2003/0201439 A1 Oct. 30, 2003

Related U.S. Application Data

(62) Division of application No. 09/498,646, filed on Feb. 7, 2000, now Pat. No. 6,576,924.

(30) Foreign Application Priority Data

Feb. 12, 1999 (JP) ................................. 11-033667

(51) Int. Cl.
*H01L 31/0376* (2006.01)
*H01L 31/20* (2006.01)
*H01L 31/036* (2006.01)

(52) U.S. Cl. ........................ 257/59; 257/72; 257/347; 257/351; 257/357

(58) Field of Classification Search ................ 257/59, 257/72, 347, 350, 351, 357
See application file for complete search history.

(56) References Cited

U.S. PATENT DOCUMENTS 5,499,123 A 3/1996 Mikoshiba (Continued)

FOREIGN PATENT DOCUMENTS

EP 0 604 006 A2 6/1994

(Continued)

OTHER PUBLICATIONS

Shimokawa et al., "Characterization of High-Efficiency Cast-Si Solar Cell Wafers by MBIC Measurement", Japanese Journal of Applied Physics, vol. 27, No. 5, May 1988, pp. 751-758.

(Continued)

*Primary Examiner*—Mary Wilczewski
*Assistant Examiner*—Khanh Duong
(74) *Attorney, Agent, or Firm*—Nixon Peabody LLP; Jeffrey Costellia

(57) ABSTRACT

A semiconductor device in which TFTs of suitable structures are arranged depending upon the performances of the circuits, and storage capacitors are formed occupying small areas, the semiconductor device featuring high performance and bright image. The thickness of the gate-insulating film is differed depending upon a circuit that gives importance to the operation speed and a circuit that gives importance to the gate-insulating breakdown voltage, and the position for forming the LDD region is differed depending upon the TFT that gives importance to the countermeasure against the hot carriers and the TFT that gives importance to the countermeasure against the off current. This makes it possible to realize a semiconductor device of high performance. Further, the storage capacity is formed by a light-shielding film and an oxide thereof to minimize its area, and a semiconductor device capable of displaying a bright picture is realized.

60 Claims, 19 Drawing Sheets

U.S. PATENT DOCUMENTS

| | | | |
|---|---|---|---|
| 5,576,887 | A | 11/1996 | Ferrin et al. |
| 5,594,569 | A | 1/1997 | Konuma et al. |
| 5,610,653 | A | 3/1997 | Abecassis |
| 5,643,826 | A | 7/1997 | Ohtani et al. |
| 5,777,701 | A * | 7/1998 | Zhang .................. 349/44 |
| 5,917,563 | A | 6/1999 | Matsushima et al. |
| 5,929,948 | A | 7/1999 | Ohori et al. |
| 5,962,872 | A | 10/1999 | Zhang et al. |
| 5,982,460 | A * | 11/1999 | Zhang et al. .............. 349/39 |
| 6,104,461 | A * | 8/2000 | Zhang et al. ............. 349/122 |
| 6,166,414 | A | 12/2000 | Miyazaki et al. |
| 6,198,517 | B1 | 3/2001 | Ohori et al. |
| 6,271,543 | B1 | 8/2001 | Ohtani et al. |
| 6,278,131 | B1 | 8/2001 | Yamazaki et al. |
| 6,316,787 | B1 | 11/2001 | Ohtani |
| 6,323,918 | B1 * | 11/2001 | Yoshioka et al. .......... 349/48 |
| 6,329,672 | B1 * | 12/2001 | Lyu et al. .................. 257/59 |
| 6,524,895 | B2 | 2/2003 | Yamazaki et al. |
| 6,576,926 | B1 | 6/2003 | Yamazaki et al. |
| 2001/0052954 | A1 | 12/2001 | Ohori et al. |

FOREIGN PATENT DOCUMENTS

| | | |
|---|---|---|
| JP | 405257164 A * | 10/1993 |
| JP | 06-138484 | 5/1994 |
| JP | 07-130652 | 5/1995 |
| JP | 07-146491 A | 6/1995 |
| JP | 07-321339 | 12/1995 |
| JP | 07-335903 | 12/1995 |
| JP | 09-312260 | 12/1997 |
| JP | 10-056184 A | 2/1998 |
| JP | 10-247735 | 9/1998 |
| JP | 10-249280 | 11/1998 |
| JP | 10-294280 | 11/1998 |
| JP | 11-191628 | 7/1999 |
| JP | 11-345767 | 12/1999 |
| JP | 11-354442 | 12/1999 |

OTHER PUBLICATIONS

Ohtani et al., "LP-B: Late-News Poster: A 60 in. HDTV Rear-Projector with Continuous-Grain Silicon Technology", May 17-22, 1998, pp. 467-470, SID 98 Digest, International Symposium Digest of Technical Papers, vol. XXIX.

Inventors: Shunpei Yamazaki et al., "Semiconductor Device and Fabrication Method Thereof" Filed: Jul. 5, 2000, Specification and Drawings for U.S. App. No. 09/610,217.

Inventors: Shunpei Yamazaki et al., "Semiconductor Device and Fabrication Method Thereof" Filed: Jul. 6, 2000, Specification and Drawings for U.S. Appl. No. 09/610,754 (w/Amendment of Mar. 11, 2002).

Inventors: Shunpei Yamazaki, "Semiconductor Device and Method of Fabricating the Same" Filed: Dec. 23, 1999, Specification and Drawings for U.S. Appl. No. 09/471,359.

Inventors: Shunpei Yamazaki, "Semiconductor Device and Method of Manufacturing Thereof" Filed: Feb. 11, 2000, Specification and Drawings for U.S. Appl. No. 09/502,675.

Inventors: Shunpei Yamazaki, "Semiconductor Device and Fabrication Method Thereof" Filed: Feb. 22, 2000, Specification and Drawings for U.S. Appl. No. 09/510,734.

Inventors: Shunpei Yamazaki, "Method for Manufacturing an Electrooptical Device" Filed: Mar. 22, 2000, Specification and Drawings for U.S. Appl. No. 09/533,175.

Inventors: Shunpei Yamazaki et al., "Semiconductor Device and Fabrication Method Thereof" Filed: Jul. 6, 2000, Specification and Drawings for U.S. Appl. No. 09/610,753 (w/Amendment of Mar. 11, 2002).

Yoshida, T. et al., "A Full-Color Thresholdless Antiferroelectric LCD Exhibiting Wide Viewing Angle with Fast Response Time", *SID 97 Digest*, pp. 841-844, Jan. 1, 1997.

Furue, H. et al., "P-78: Characteristics and Driving Scheme of Polymer-Stabilized Monostable FLCD Exhibiting Fast Response Time and High Contrast Ratio with Gray-Scale Capability", *SID 98 Digest*, pp. 782-785, Jan. 1, 1998.

* cited by examiner

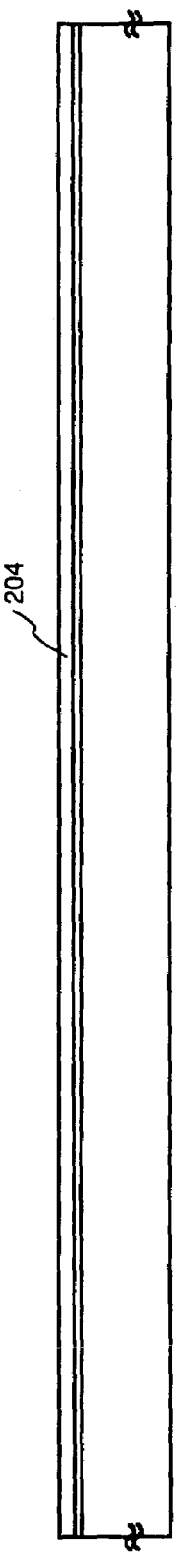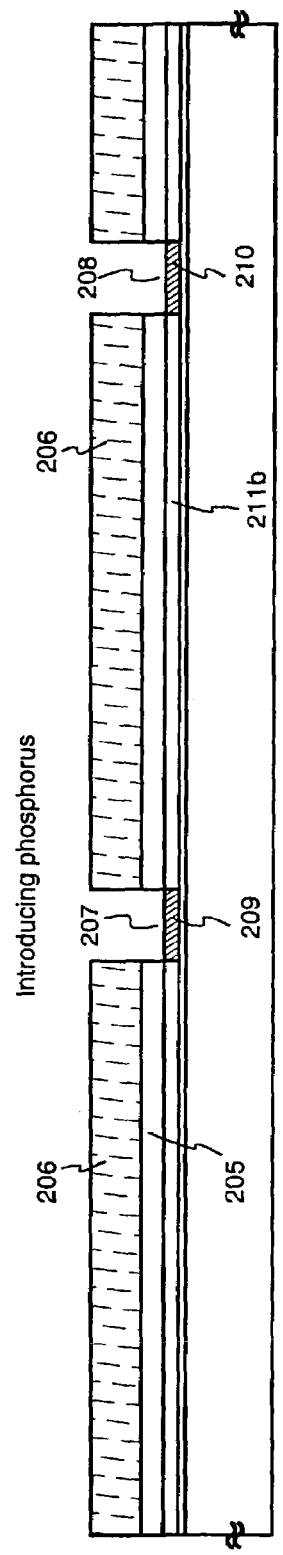

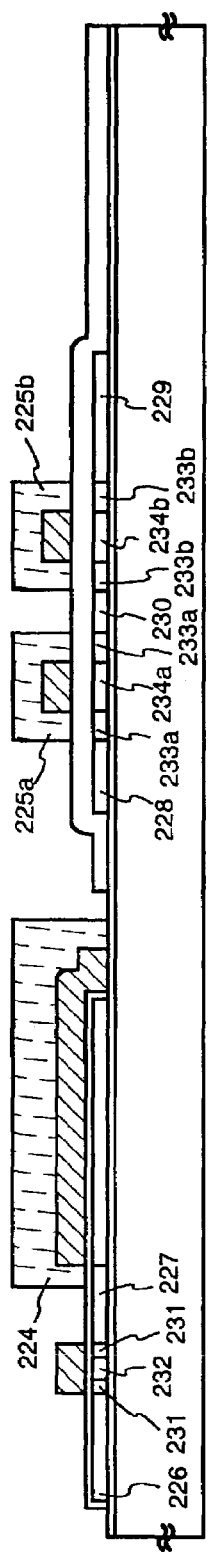
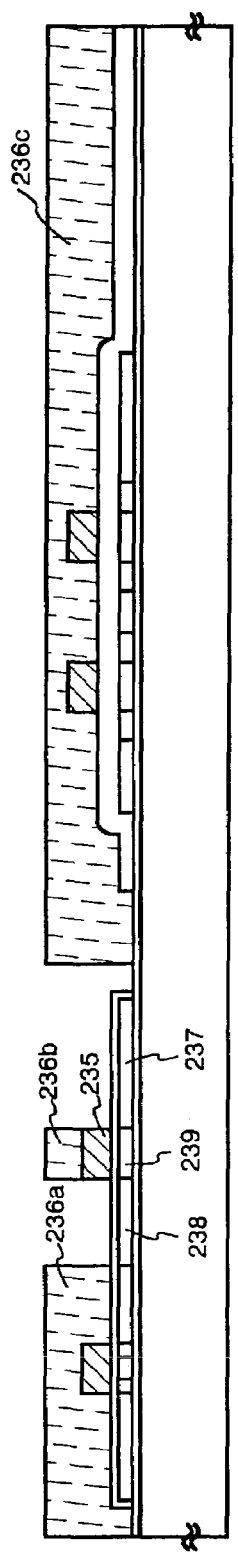
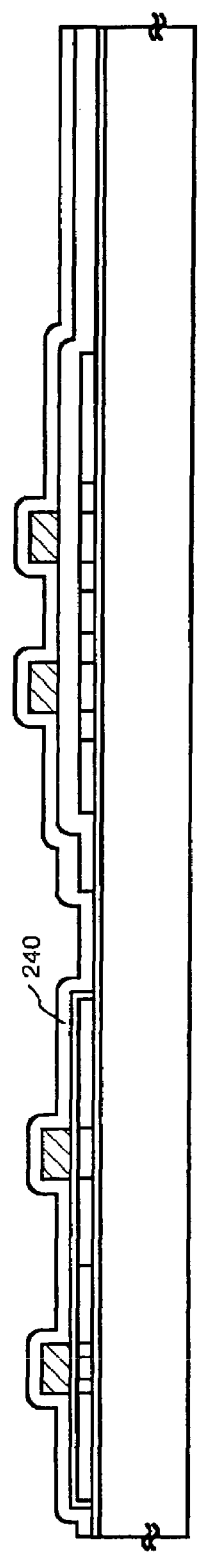
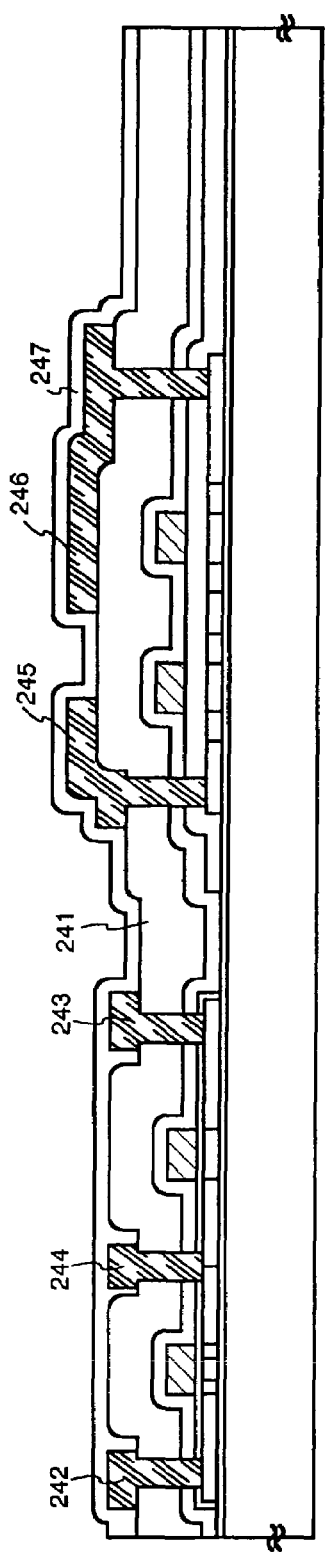
Fig. 4A
Fig. 4B
Fig. 4C
Fig. 4D

Introducing a dopant impurity

Drive circuit unit

Pixel unit

CMOS circuit region shown by the hatching

CMOS circuit region shown by the hatching

Pixel matrix circuit region shown by the hatching

NTFT    PTFT

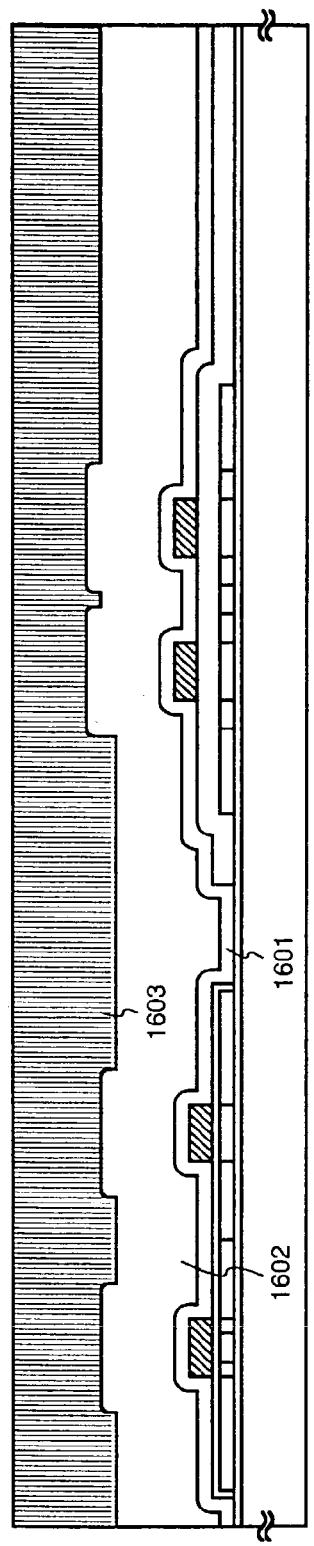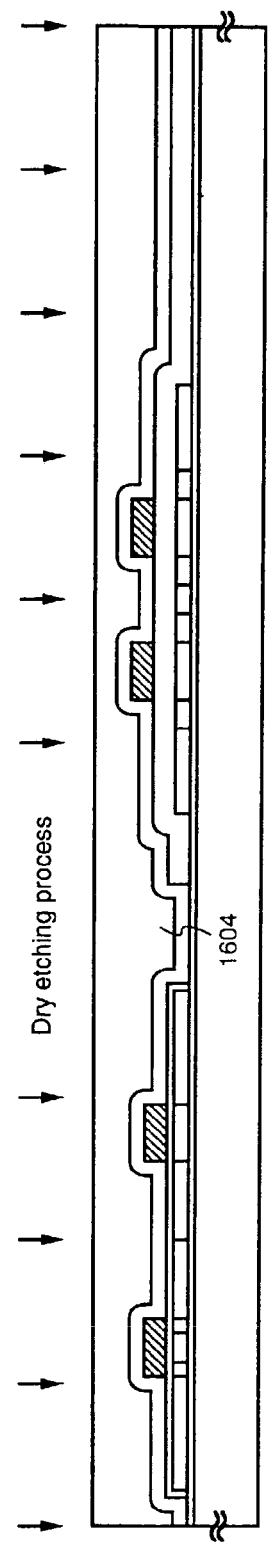

SEMICONDUCTOR DEVICE HAVING THIN FILM TRANSISTOR AND LIGHT-SHIELDING FILM

BACKGROUND OF THE INVENTION

1. Field of the Invention

The present invention relates to a semiconductor device having a circuit constituted by thin-film transistors (hereinafter referred to as TFTs). More particularly, the invention relates to an electronic device as represented by, for example, a liquid crystal display and to an electric appliance using such an electronic device as a display unit. In this specification, the semiconductor device refers to devices in general that work by utilizing the semiconductor characteristics. Therefore, electronic devices, semiconductor circuits and electric appliances are all semiconductor devices.

2. Description of the Related Art

Thin-film transistors (TFTs) can be formed on a transparent substrate and, hence, development has been positively forwarded for applying them to the active matrix-type liquid crystal display (hereinafter referred to as AM-LCD). The TFT using a crystalline semiconductor film (typically, a polysilicon film) exhibits a high mobility, and makes it possible to realize a highly precise image display by integrating functional circuits on the same board.

The AM-LCD basically comprises a pixel unit for displaying a picture, a gate drive circuit for driving TFTs of the pixels arranged in the pixel unit, and a source drive circuit (or a data drive circuit) for sending pixel signals to the TFTs, that are formed on the same substrate. In this specification, the gate drive circuit and the source drive circuit are all referred to as drive circuit units.

In recent years, there has been proposed a system-on-panel in which signal processing circuits such as signal-dividing circuit and Y-correction circuit, too, are formed on the same substrate in addition to the pixel unit and the drive circuit unit.

However, the pixel unit and the drive circuit unit require different circuit performances, and it is difficult to satisfy all circuit specifications by the TFTs of the same structure. That is, the structure of the TFT has not yet been established to simultaneously satisfy the TFTs (hereinafter referred to as pixel TFTs) that constitute the drive circuit unit such as shift register circuit which gives importance on the high-speed operation and that also constitute the pixel unit which gives importance on the high breakdown voltage characteristics.

The present applicant therefore has filed an application covering a constitution in which the gate insulating film has a different thickness depending upon the TFT's (hereinafter referred to as drive TFTs) forming the drive circuit unit and the pixel TFTs (Japanese Patent Laid-Open No. 10-056184). Concretely speaking, in the above application, the thickness of the gate insulating film of the drive TFTs is decreased to be smaller than the thickness of the gate insulating film of the pixel TFTs.

In recent years, each pixel in the pixel unit has been formed having an area as very small as about 18 μm×18 μm to realize a picture of as highly fine as XGA (eXtended Graphics Array, which is 1024×768 pixels) on a liquid crystal panel having a diagonal of 0.9 inch. It is expected that the size of the pixels will be further reduced in the future.

The greatest problem that stems from a reduction in the size of the pixels is a decrease in the numerical aperture in the transmission-type liquid crystal display. That is, the effective area for displaying the picture decreases, and the brightness decreases. If it is attempted to increase the numerical aperture, a countermeasure must be taken, such as decreasing the area occupied by the TFTs or decreasing the area occupied by the storage capacitors.

Thus, performance required for the TFTs and occupied areas are placed under very severe conditions accompanying a reduction in the size of the pixels and, besides, areas occupied by the storage capacitors are placed under severe conditions, too, making it very difficult to design the structure of the pixels.

SUMMARY OF THE INVENTION

The present invention was accomplished in view of the problems described above, and provides the structure of a pixel in which a highly reliable TFT is formed using a small area and the area occupied by the storage capacity is suppressed to a minimum degree. Thus, a bright and highly fine image picture is realized even by an electronic device of a pixel size which is as very small as a square of several tens of microns.

The invention further improves operation performance and reliability of the electronic device by suitably designing the structure of the TFTs arranged in the circuits depending on the functions of the circuits.

The invention further enhances operation performance and reliability of a semiconductor device (electric appliance) that uses the above electronic device (typically, a liquid crystal display, an electroluminescence display, an electrochromics display or a field emission display) as a display unit (display).

The constitution of the invention disclosed in this specification is concerned with a semiconductor device including a pixel unit and a drive circuit unit on the same substrate, wherein LDD regions of drive TFT's forming the drive circuit unit are so arranged as will be overlapped on the gate wirings of the drive TFTs to sandwich the gate-insulating films of the drive TFTs therebetween, LDD regions of pixel TFTs forming the pixel unit are so arranged as will not be overlapped on the gate wiring layers of the pixel TFTs so will not to sandwich the gate insulating films of the pixel TFTs therebetween, and the storage capacitors of the pixel unit are formed by a light-shielding film formed over the pixel TFTs, an oxide of the light-shielding film and pixel electrodes.

The constitution of the invention related to the method of manufacturing comprises:

a step for forming a channel-forming region, a source region, a drain region, and an LDD region sandwiched between the drain region and the channel-forming region in the active layers of NTFTs forming the drive circuit unit:

a step for forming a channel-forming region, a source region and a drain region in the active layers of PTFTs forming the drive circuit unit; and a step for forming a channel-forming region, a source region, a drain region, and an LDD region sandwiched between the drain region and the channel-forming region in the active layers of pixel TFTs forming the pixel unit; wherein the LDD regions of the NTFTs forming the drive circuit unit are so formed as will be overlapped on the gate wirings of the NTFTs forming the drive circuit unit to sandwich the gate-insulating films therebetween;

the LDD regions of the pixel TFTs are so formed as will not to be overlapped on the gate wirings of the pixel TFTs so will not to sandwich the gate insulating films therebetween; and the storage capacitors in the pixel unit are formed by a light-shielding film formed over the pixel TFTs, an oxide of the light-shielding film and pixel electrodes.

More concretely, the invention is concerned with a method of manufacturing a semiconductor device which includes a pixel unit and a drive circuit unit on the same substrate, comprising:

a first step for forming an active layer on the substrate;

a second step for forming a gate-insulating film on the active layer;

a third step for forming an electrically conducting film on the gate-insulating film;

a fourth step for forming gate wirings of NTFTs that form the drive circuit unit by patterning the electrically conducting film;

a fifth step for forming n-regions m the active layers of NTFTs forming the drive circuit unit by adding an element belonging to the Group 15 of periodic table using the gate wirings of the NTFTs forming the drive circuit unit as a mask;

a sixth step for forming n-regions under the gate wirings of the NTFTs forming the drive circuit unit by diffusing the n-regions by heat treatment;

a seventh step for forming gate wirings of the pixel TFTs forming the pixel unit by patterning the electrically conducting film;

an eighth step for forming n⁻-regions in the active layers of the pixel TFTs by adding an element belong to the Group 15 of periodic table by using the gate wirings of the pixel TFTs as a mask;

a ninth step for forming n⁺-regions in the active layers of NTFTs forming the drive circuit unit and in the active layer of the pixel TFTs by adding an element belonging the Group 15 of periodic table;

a tenth step for forming gate wirings of the PTFTs forming the drive circuit unit by patterning the electrically conducting film;

an eleventh step for forming p⁺-regions in the active layers of PTFTs forming the drive circuit unit by adding an element belong to the Group 13 of periodic table by using the gate wirings of PTFTs forming the drive circuit unit as a mask;

a twelfth step for forming a interlayer-insulating film which is a resin film over the NTFTs and PTFTs forming the drive circuit unit and over the pixel TFTs forming the pixel unit;

a thirteenth step for forming a light-shielding film on the interlayer-insulating film;

a fourteenth step for forming an oxide of the light-shielding film on the surface of the light-shielding film; and a fifteenth step for forming pixel electrodes in contact with the oxide of the light-shielding film and overlapped on the light-shielding film.

BRIEF DESCRIPTION OF THE DRAWINGS

FIGS. 2A to 2D are views illustrating the steps for manufacturing the AM-LCD;

FIGS. 4A to 4D are views illustrating the steps for manufacturing the AM-LCD;

FIGS. 16A and 16B are views illustrating the steps for manufacturing the AM-LCD;

DESCRIPTION OF THE PREFERRED EMBODIMENTS

An embodiment of the invention will now be described with reference to FIG. 1 which is a sectional view illustrating an AM-LCD in which a drive circuit unit and a pixel unit are formed integrally together on the same substrate. Here, a CMOS circuit is shown as a representative basic circuit for constituting the drive circuit unit, and TFTs of a double-gate structure are shown as pixel TFTs. It is allowable to use a triple-gate structure or a single-gate structure not being limited to the double-gate structure only, as a matter of course.

Figure 1:
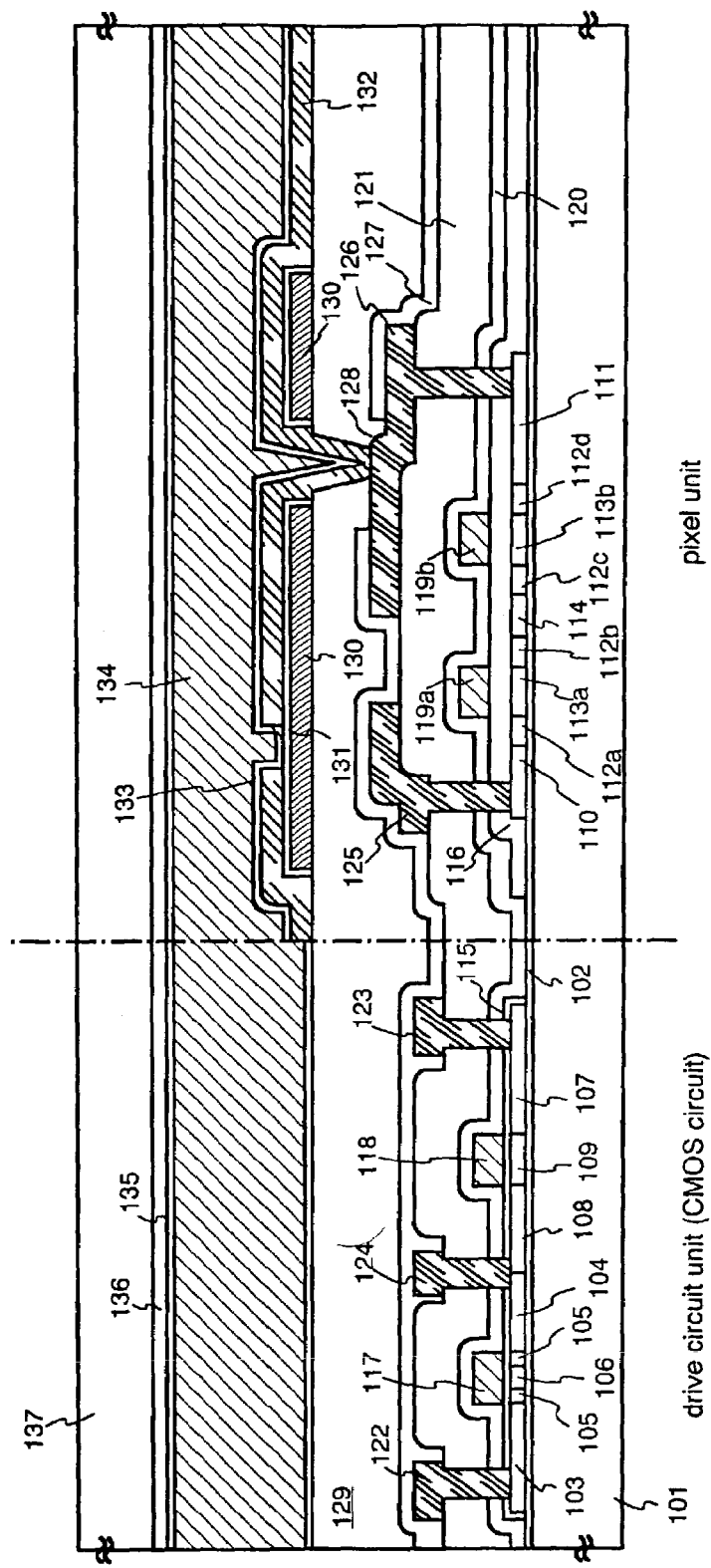
FIG. 1 is a view illustrating the structure of an AM-LCD in cross section.

In FIG. 1, reference numeral 101 denotes a substrate having heat resistance, which may be a quartz substrate, a silicon substrate, a ceramics substrate or a metal substrate (typically, a stainless steel substrate). Whichever substrate is used, a base film (preferably, an insulating film comprising chiefly silicon) may be formed, as required.

Reference numeral 102 denotes a silicon oxide film formed as a base film on which are formed active layers of drive TFTs, active layers of pixel TFTs and semiconductor layers serving as lower electrodes of the storage capacitors. In this specification, the "electrode" is part of the "wiring", and represents a portion where it is electrically connected to other wiring or intersects the semiconductor layer. Therefore, though the words "wiring" and "electrode" are used separately for the sake of explanation, it should be noted that the "electrode" is always included in the word "wiring".

In FIG. 1, the active layer of the drive TFT is formed by a source region 103, a drain region 104, an LDD (lightly doped drain) region 105 and a channel-forming region 106 of an N-channel TFT (hereinafter referred to as NTFT), and by a source region 107, a drain region 108 and a channel-forming region 109 of a P-channel TFT (hereinafter referred to as PTFT).

Further, the active layer of the pixel TFT (an NTFT is used here) is formed by a source region 110, a drain region 111, LDD regions 112a to 112d and channel-forming regions 113a, 113b. Reference numeral 114 denotes an impurity region of a high concentration existing between the channel-forming regions 113a and 113b, and has the same composition as the source region 110 and the drain region 111 (contains the same impurity at the same concentration). This region works as a stopper region for preventing the minority carriers generated at a drain terminal from migrating into the source region, that could become a cause of off current.

A gate-insulating film is formed to cover the active layer. In this invention, the gate-insulating film 115 of the drive TFT is formed having a thickness smaller than that of the gate insulating film 116 of the pixel TFT. Typically, the gate-insulating film 115 is formed maintaining a thickness of from 5 to 50 nm (preferably, from 10 to 30 nm) and the gate-insulating film 116 is formed maintaining a thickness of from 50 to 200 nm (preferably, from 100 to 150 nm).

The gate-insulating film of the drive TFT needs to be limited to the one of a single thickness. That is, the drive TFTs having dissimilar insulating films may exist in the drive circuit unit. In this case, at least three or more kinds of TFTs having dissimilar gate-insulating materials exist on the same substrate.

Next, gate wirings 117 and 118 of the drive TFT and the gate electrodes 119a, 119b of the pixel TFT are formed on the gate-insulating films 115 and 116. A heat resistant electrically conducting film that withstands the temperature of 800 to 1150° C. (preferably 900 to 1100° C.) is used as a material for forming the gate wirings 117 to 119.

Typically, there may be used an electrically conducting silicon film (e.g., phosphor-doped silicon film, boron-doped silicon film, etc.), a metal film (e.g., tungsten film, tantalum film, molybdenum film, titanium film), a silicide film formed by transforming the metal film into a silicide thereof, or a nitrogenated film thereof (tantalum nitride film, tungsten nitride film, titanium nitride film, etc.). Or, these films may be laminated by freely combining them.

When the metal film is to be used, it is desired to employ a laminated structure with the silicon film in order to prevent the oxidation of the metal film (which increases the wiring resistance). From the standpoint of preventing oxidation, further, a structure is effective in which the metal film is covered with an insulating film containing silicon.

As the insulating film containing silicon, there can be used a silicon oxide film, a silicon nitride film, or a silicon oxynitride film. The silicon oxynitride film stands for an insulating film containing oxygen, nitrogen and silicon at a predetermined ratio.

An insulating film containing silicon may be formed as the uppermost layer at the time of forming the gate wiring using the above material, and the gate wiring pattern may be formed by etching the insulating film containing silicon and the above material at one time. In this case, the upper surface only of the gate wiring is protected by the silicon-containing insulating film.

Further, the laminated structure of the metal silicide film and the silicon film exhibits an increased heat resistance and is strong against the oxidation though the resistance increases to some extent as compared with when the metal film is used. In this case, the protection film is not particularly needed for preventing the oxidation. Despite the oxidation takes place, a silicon oxide film is simply formed on the surface, but the wiring resistance does not increase.

Reference numeral 120 denotes a first interlayer-insulating film (lower layer) and 121 denotes a first interlayer-insulating film (upper layer), which are formed of a silicon-containing insulating film. Upon them are formed source wirings 122 and 123 and drain wiring 124 of the drive TFT, or source wiring 125 and drain wiring 126 of the pixel TFT.

A passivation film 127 is formed thereon. The passivation film 127 has an opening 128 formed on the drain wiring 126, and a second interlayer-insulating film 129 is formed so as to cover them. A resin film having a small dielectric constant is desired as the second interlayer-insulating film 129. As the resin film, there can be used a polyimide film, an acrylic film, a polyamide film, a BCB (benzocyclobutene) film, and MSSQ (methyl silsesquioxane).

A light-shielding film 130 which is an aluminum film or a film comprising chiefly aluminum (film formed by adding other elements as impurities to the aluminum film) is formed on the second interlayer-insulating film 129, and on the surface thereof is formed an oxide (alumina film) 131 formed by oxidizing the light-shielding film 130. It is desired that the light-shielding film 130 is tapered at about 60 to 85 degrees for being patterned. The oxide 131 may be formed by the anodic oxidation method, hot oxidation method or plasma oxidation method. Examples of other elements used as impurities include titanium, scandium, neodymium and silicon.

A contact hole is formed in the second interlayer-insulating film 129 and, then, a pixel electrode 132 is formed. The pixel electrode 132 is electrically connected to the drain wiring 126 through the contact hole. Here, a transparent electrically conducting film may be used as a pixel electrode when the transmission-type AM-LCD is to be manufactured and a metal film having a high reflection factor may be used when the reflection-type AM-LCD is to be manufactured.

A storage capacity using the oxide 131 as a dielectric is formed in a region where the light-shielding film 130 and the pixel electrode 132 are overlapped one upon the other. The oxide 131 is an alumina film and has a dielectric constant of as large as 8 to 10, and has a thickness of as small as 30 to 100 nm (preferably, 50 to 70 nm) forming a large capacity despite its small area.

The contact hole through which the pixel electrode 132 is electrically connected to the drain wiring 126 forms a gap in the light-shielding film and permits light to pass through. However, the underlying drain wiring 126 completely prevents the leakage of light.

Further, the pixel electrode 132 is covered with an alignment film 133. A liquid crystal 134 is held on the alignment film 133. The liquid crystal 134 is held on the pixel unit by a sealing member (not shown) that also works as a spacer relative to the opposing substrate.

On the liquid crystal 134 are provided an alignment film 135 on the side of the opposing substrate, an opposing electrode (also referred to as common electrode) 136 comprising a transparent electrically conducting film, and a glass substrate 137. The alignment film 135, opposing electrode and glass substrate 137 are collectively referred to as the opposing substrate. In the single-plate type liquid crystal display, a color filter is further provided on the side of the opposing substrate.

The semiconductor device of the invention having the above structure features the following points.

First, among the drive TFTs basically forming the drive circuit unit, the NTFT has the structure in which the LDD region 105 is completely overlapped on the gate wiring 117. This is to cope with the hot carriers like in the widely-known GOLD (Gate-Drain Overlapped LDD) structure. The PTFT, on the other hand, is little deteriorated by the hot carriers and may have the existing structure.

Further, a feature resides in that the gate-insulating film 115 of the drive TFT has a thickness which is about one-fifth to one-tenth that of the gate-insulating film 116 of the pixel TFT. This is to increase the operation speed. Since the operation voltage is low, the gate-insulating film may have a thickness of 5 to 50 nm.

The pixel TFT has basic circuit specifications which are different from those of the drive TFT. First, suppressing the off current (drain current that flows when the TFT is in the off state) takes precedence over the operation speed. Therefore, an ordinary LDD structure is employed. This makes a difference in the structure from the drive TFT in regard to that the LDD regions 112a to 112d are not overlapped on the gate wirings 119a and 119b.

Further, a high voltage of a maximum of about 16 V is applied to the gate-insulating film 116. Therefore, a countermeasure is taken for increasing the breakdown voltage by selecting the film thickness to be from 50 to 200 nm (preferably, from 100 to 150 nm).

The feature further resides in that the storage capacity is formed by using the oxide 131 formed on the light-shielding film 130 as a dielectric, in order to enhance the numerical aperture. The storage capacity is formed by the light-shielding film 130, oxide 131 and pixel electrode 132.

As described above, the semiconductor device of the invention has a variety of features in the drive circuit unit and in the pixel unit, forms a bright and highly fine picture owing to the synergistic effect of the features, making it possible to provide an electronic device that features high operation performance and high reliability. The invention further provides an electric appliance of high performance mounting the above electronic device as a part.

The thus constituted invention will now be described in further detail by way of embodiments.

Embodiment 1

This embodiment explains, with reference to FIGS. 2A to 5B, the steps of manufacturing for realizing the structure of FIG. 1 described earlier.

First, a quartz substrate 201 is prepared, and on which are continuously formed a silicon oxide film 202 having a thickness of 20 nm and an amorphous silicon film 203 without exposing them to the open atmosphere. This prevents impurities such as boron and the like contained in the atmosphere from being adsorbed by the lower surface of the amorphous silicon film (FIG. 2A).

Though this embodiment uses an amorphous silicon film, any other semiconductor film may be used. There may be used a microcrystalline silicon film or an amorphous germanium film. The film is so formed as will finally has a thickness of from 25 to 40 nm by taking into consideration the subsequent step of thermal oxidation.

Next, the amorphous silicon film is crystallized. This embodiment employs technique disclosed in Japanese Patent Laid-Open No. 9-312260 as crystallization means. The technique disclosed in this publication uses an element selected from nickel, cobalt, palladium, germanium, platinum, iron, copper, tin and lead as a catalytic element for assisting the crystallization.

In this embodiment, nickel is selected as a catalytic element, a layer (not shown) containing nickel is formed on the amorphous silicon film 203 and is crystallized through the heat treatment at 550° C. for 4 hours. Thus, a crystalline silicon (polysilicon) film 204 is formed (FIG. 2B).

Here, an impurity element (phosphorus or boron) may be added to the crystalline silicon film 204 to control the threshold voltage of the TFT. Both phosphorus and boron may be added, or either one of them may be added. Here, if phosphorus is added in advance to the region that finally serves as the first capacitor electrode of the storage capacity, then, this region can be used as an electrode, which is desirable.

Next, a masking film 205 which is a silicon oxide film is formed maintaining a thickness of 100 nm on the crystalline silicon film 204, and a resist mask 206 is further formed thereon. The masking film 205 is etched using the resist mask 206 as a mask thereby to form openings 207 and 208.

In this state, an element (phosphorus in this embodiment) belonging to the Group 15 of periodic table is added to form phosphorus-doped regions (phosphorus-added regions 209 and 210. The concentration of phosphorus that is added is desirably from $5 \times 10^{18}$ to $1 \times 10^{20}$ atoms/cm$^3$ (preferably, $1 \times 10^{19}$ to $5 \times 10^{19}$ atoms/cm$^3$). Here, however, the concentration of phosphorus to be added varies depending upon the temperature and time in a subsequent gettering step and upon the area of the phosphorus-doped region, and is in no way limited within this range (FIG. 2C).

Next, the resist mask 206 is removed and is heat-treated at 450 to 650° C. (preferably, 500 to 600° C.) for 2 to 16 hours to getter nickel remaining in the crystalline silicon film. The gettering action is obtained requiring a temperature of about ±50° C. from a maximum temperature of thermal hysteresis. Here, since the heat treatment for crystallization is effected at 550 to 600° C., the gettering action is obtained to a sufficient degree by the heat treatment at 500 to 650° C.

In this embodiment, the heat treatment is effected at 600° C. for 8 hours, whereby nickel migrates in the directions of arrows (see FIG. 2D) so as to be gettered in the phosphorus-doped regions 209 and 210. Thus, the concentration of nickel remaining in the crystalline silicon films denoted by 211a and 211b decreases down to $2 \times 10^{17}$ atoms/cm$^3$ or smaller (preferably, $1 \times 10^{16}$ atoms/cm$^3$ or smaller). This concentration, however, is the result of measurement by the mass secondary ionic analysis (SIMS), and the concentration lower than this value has not at present been confirmed due to limitation of the measurement (FIG. 2D).

After the step of nickel gettering has been finished as described above, the crystalline silicon films 211a and 211b are patterned to form an active layer (semiconductor layer) 212 of the CMOS circuit and an active layer 213 of the pixel TFT. In this case, it is desired to completely remove the phosphorus-added region that has trapped nickel.

Figure 3A:
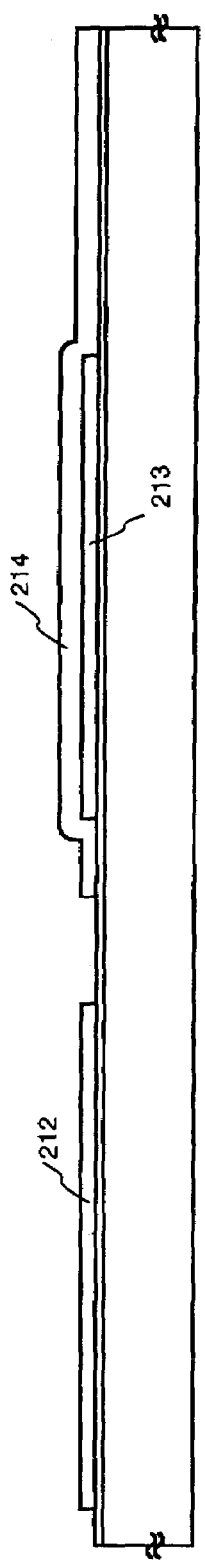
FIGS. 3A to 3D are views illustrating the steps for manufacturing the AM-LCD.

Then, an insulating film (not shown) is formed by the plasma CVD method or the sputtering method, and is patterned to form a gate-insulating film 214. The gate-insulating film is the one that serves as the gate-insulating film for the pixel TFT, and has a thickness of 50 to 200 nm. This embodiment uses a silicon oxide film having a thickness of 80 nm. There may be used other silicon-containing insulating film in the form of a single layer or laminated layers (FIG. 3A).

Here, the gate-insulating film 214 that is formed is allowed to remain on the pixel TFT but is removed from the region where the CMOS circuit is to be formed. Though this embodiment refers to the CMOS circuit only, the gate-insulating film, in practice, is removed from the region on where part of the drive circuit unit (group of circuits that must operate at high speeds) is to be formed. As far as the circuit in which a high voltage is applied to the gate-insulating film, such as a buffer circuit, is concerned, therefore, it is desired to leave the insulating film having a thickness equal to that of the gate-insulating film 214.

Next, the heat treatment is effected at a temperature of from 800 to 1150° C. (preferably, from 900 to 1100° C.) for 15 minutes to 8 hours (preferably, 30 minutes to 2 hours) in an oxidizing atmosphere (step of thermal oxidation). In this embodiment, the heat-treatment is effected in an oxygen atmosphere at 950° C. for 30 minutes.

The oxidizing atmosphere may be a dry oxygen atmosphere or a wet oxygen atmosphere. However, the dry oxygen atmosphere is suited for decreasing crystal defects in the semiconductor layer. It is further allowable to use an oxygen atmosphere which contains a halogen element. The effect for removing nickel can be expected through the step of thermal oxidation in an atmosphere containing a halogen element.

Through the step of thermal oxidation as described above, a silicon oxide film (thermally oxidized film) 215 is formed maintaining a thickness of from 5 to 50 nm (preferably, from 10 to 30 nm) on the portion where the gate-insulating film 214 was not formed (portion where the active layer is exposed). In this embodiment, the silicon oxide film 215 is formed maintaining a thickness of 30 nm, and finally serves as a gate-insulating film for the CMOS circuit.

The oxidation reaction also proceeds even on an interface between the gate-insulating film 214 which is the silicon oxide film remaining on the pixel TFT and the semiconductor layer 213 formed thereunder. Finally, therefore, the thickness of the gate-insulating film 216 of the pixel TFT becomes 50 to 200 nm (preferably, from 100 to 150 nm). In this embodiment, the thickness becomes 110 nm.

In this embodiment, the silicon oxide film 215 is formed by the thermal oxidation method. The thin silicon oxide film, however, may be formed by a low-pressure thermal CVD method. In this case, the film-forming temperature may be about 800° C., and the film-forming gas may comprise silane and oxygen.

Figure 3B:
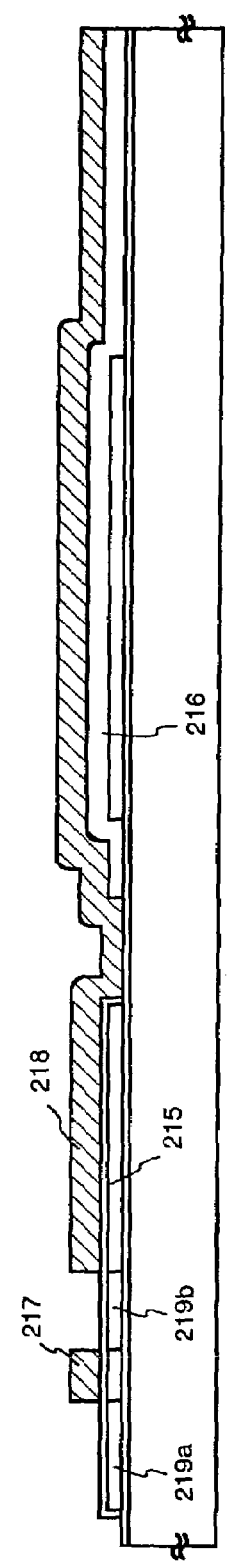

The step of thermal oxidation is followed by the formation of an electrically conducting film comprising a silicon film/tungsten silicide film of a laminated structure. The electrically conducting film is then patterned to form a gate wiring 217 of the NTFT in the CMOS circuit. In this case, the electrically conducting film 218 of the above constitution is left on the region on where PITT and pixel TFT of the CMOS circuit are to be formed (FIG. 3B).

In this constitution, the silicon film located under the electrically conducting film may have a thickness of from about 20 to about 70 nm. Here, it is desired to employ the low-pressure thermal CVD method for forming films. This is because, the gate-insulating film of the CMOS circuit has a very small thickness and, hence, employment of the sputtering method or the plasma CVD method may leave damage in the insulating film.

The material of the gate wiring that can be used in this embodiment is not limited thereto only, but may be any material described earlier, as a matter of course.

In this embodiment, the electrically conducting film 218 has a thickness of 300 nm.

After the electrically conducting film has been patterned, an element (phosphorus in this embodiment) belonging to the Group 15 of periodic table is added using the gate wiring 217 and resist mask (not shown) used for forming the electrically conducting film 218, as a mask, thereby to form impurity regions (hereinafter, these regions are referred to as n-regions) 219a and 219b.

In this invention, the impurity element for imparting the type of electric conduction may be added by the ion implantation method that effects mass separation or by the plasma doping method that does not effect mass separation.

In this case, the setpoint dosage is so adjusted that phosphorus is contained in the n-regions 219a and 219b at a concentration (the concentration is denoted by n) of from $1\times10^{18}$ to $1\times10^{19}$ atoms/cm$^3$. The concentration has an important meaning in the step of heat treatment executed next time.

Figure 3C:
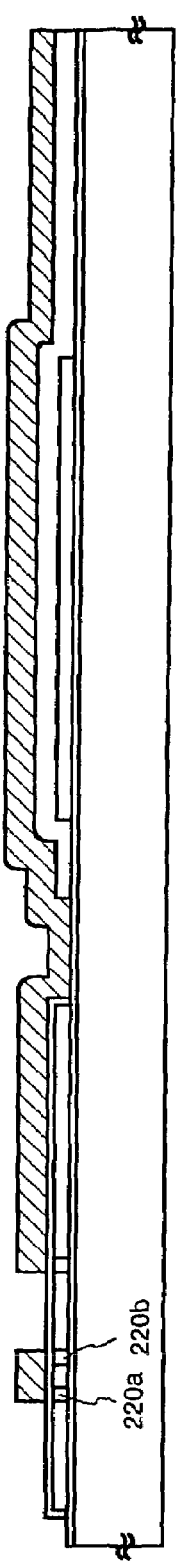

Next, the resist mask that is not shown is removed, and the heat treatment is effected in a temperature range of from 700 to 1000° C. (preferably, from 800 to 900° C.) to activate phosphorus. At the same time, phosphorus is diffused in the transverse direction to form low-concentration impurity regions (hereinafter referred to as n-regions) 220a and 220b overlapped on the gate wiring 217. The n$^-$-regions 220a and 220b contain phosphorus at a concentration of from $5\times10^{17}$ to $5\times10^{18}$ atoms/cm$^3$ (FIG. 3C).

The diffusing distance of the impurities can be controlled depending on the temperature and time of the heat treatment. Therefore, the length (width) of the n$^-$-type regions 220a and 220b can be freely controlled. In this embodiment, the overlapping distance is adjusted to be from 0.3 to 1 µm (preferably, from 0.5 to 0.7 µm).

Thus, the concentration in the n-regions 219a and 219b is determined depending on the activation conditions and the phosphorus concentration and length required by the n$^-$-regions.

Through the step of heat treatment, the active layer of the CMOS circuit is oxidized again, and the thickness of the gate-insulating film 215 increases. Under the heat-treating conditions for forming the above n$^-$-regions, the thickness increases typically by 20 to 50 nm. However, an increase in the film thickness can be prevented by a cap layer and then effecting the heat treatment to prevent oxidation.

At the same time, further, the gate wiring 217 and electrically conducting film 218 are oxidized to form a thermally oxidized film on the surfaces thereof. When the laminated film of the silicon film and the metal silicide film is used as in this embodiment, silicon is preferentially oxidized on the surface. Accordingly, the thermally oxidized film that is formed is a silicon oxide film.

Figure 3D:
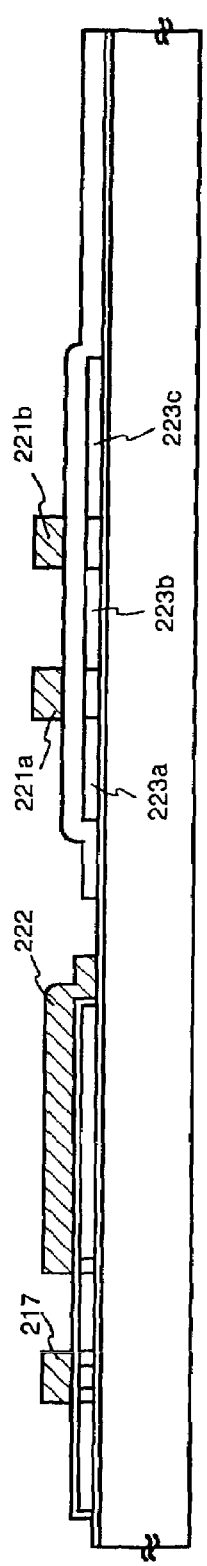

Next, the electrically conducting film 218 is patterned to form gate wirings 221a and 221b of the pixel TFT. Here, the electrically conducting film 222 is left on the PTFT in the CMOS circuit (FIG. 3D).

Then, an element (phosphorus in this embodiment) belonging to the Group 15 of periodic table is added using the gate wirings 217, 221a and 221b and electrically conducting film 222 as masks to form low-concentration impurity regions 223a to 223c containing phosphorus at a concentration of from $5\times10^{16}$ to $1\times10^{18}$ atoms/cm$^3$ (hereinafter referred to as n-regions). In this case, phosphorus is added to the above n-regions 219a and 219b, too. However, the concentration of phosphorus added is very lower than that of phosphorus that has been contained in the n-regions, and an increase in the amount of phosphorus imposes no problem.

In this embodiment, further, the n$^-$-regions are formed in order to increase the resistance as much as possible and to suppress the off current. In the step of adding phosphorus, therefore, it is also possible to from the n$^-$-regions instead of the n$^-$-regions.

Further, this step may be separately effected for the drive circuit unit where the gate-insulating film has a small thickness and for the pixel unit where the gate-insulating film has a large thickness. Or, the step may be effected simultaneously. Here, however, the concentration in the LDD region must be carefully conducted. In this embodiment, therefore, the concentration of phosphorus that is added is distributed (concentration profile) as shown in FIG. 6 based on the plasma doping method.

Figure 6:
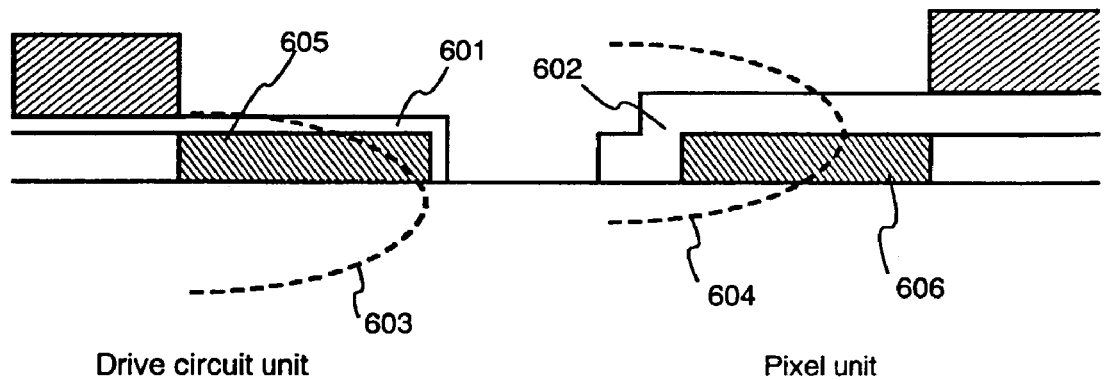
FIG. 6 is a view illustrating a relation of concentration distribution of when impurity elements are added.

In FIG. 6, the gate-insulating film 601 on the side of the drive circuit unit and the gate-insulating film 602 on the side of the pixel unit have different thicknesses. Therefore, the distribution of phosphorus concentration differs in the direction of depth.

In this embodiment, the conditions for adding phosphorus (acceleration voltage, etc.) are so adjusted that the concentration is distributed as designated at 603 on the side of the drive circuit unit and that the concentration is distributed as designated at 604 on the side of the pixel unit. In this case, though the concentration distribution differs in the direction of depth, the phosphorus concentration eventually becomes nearly equal between the low-concentration impurity regions 605 and 606.

The step shown in FIG. 6 can be employed in all steps for adding impurities described in this specification.

Next, resist masks 224, 225a and 225b are formed, an element (phosphorus in this embodiment) belong to the Group 15 of periodic table is added to form high-concentration impurity regions 226 to 230 containing phosphorus at a concentration of from $5\times10^{19}$ to $1\times10^{21}$ atoms/cm$^3$ (hereinafter referred to as n$^+$-regions)(FIG. 4A).

Through this step, the source region 226, drain region 227, LDD region 231 and channel-forming region 232 are defined for the NTFT in the CMOS circuit. Further, the source region 228, drain region 229, LDD regions 233a and 233b and channel-forming regions 234a and 234b are defined for the pixel TFT.

The n$^+$-region 230 works as a stopper region for preventing the migration of minority carriers (positive holes in this embodiment) that become a cause of off current. Here, if not particularly, required, the LDD regions 233a and 233b may be contacted to each other.

After the state of FIG. 4A is obtained, the electrically conducting film 222 remaining on the region where the PTFT of CMOS circuit will be formed is patterned to form a gate wiring 235. By using the resist masks 236a to 236c, an element (boron in this embodiment) belonging to the Group 13 of periodic table is added to form high-concentration impurity regions 237 and 238 containing boron at a concentration of from $5\times10^{19}$ to $1\times10^{21}$ atoms/cm$^3$ (hereinafter referred to as P$^+$-regions)(FIG. 4B).

Through this step, the source region 237, drain region 238 and channel-forming region 239 are defined for the PTFT in the CMOS circuit.

Thus, the formation of all impurity regions is finished. The order of adding impurities is not limited to the one described in this embodiment but may be changed in various ways. The order of adding impurities can be suitably determined by a person who conducts the process by taking into consideration problems associated with the performance of the device.

After the impurity regions have been formed, the resist masks 236a to 236c are removed. An insulating film (silicon-containing insulating film) 240 is formed maintaining a thickness of from 60 to 200 nm (preferably, from 100 to 150 nm) under the first interlayer-insulating film. This insulating film works as a protection film for protecting the gate wiring from being oxidized, and it is, hence, desired to use a silicon oxynitride film.

After the first interlayer-insulating film (lower layer) 240 is formed, the heat treatment is effected at a temperature over a range of from 550 to 800° C. for 1 to 8 hours. In this embodiment, the heat treatment is conducted at 600° C. for 2 hours in a nitrogen atmosphere (FIG. 4C).

This step activates phosphorus or boron added to the impurity regions and, at the same time, recovers damage given to the gate-insulating film and to the active layer due to the addition of impurities. Here, it is desired to activate phosphorus or boron while suppressing their diffusion as much as possible. When it is necessary to heat at high temperatures, attention must be given to that phosphorus and boron in each TFT tend to diffuse into the channel-forming region.

Further, the hydrogenation treatment is effected at 350° C. for one hour. The hydrogenation treatment is to expose impurities to hydrogen excited by heat or plasma.

After the state of FIG. 4C is obtained, a first interlayer-insulating film (upper layer) 241 is formed. As the first interlayer-insulating film (upper layer) 241, there may be used a silicon-containing insulating film (silicon oxide film in this embodiment).

Next, a contact hole is formed in the first interlayer-insulating film (upper layer) 241 and in the first interlayer-insulating layer film (lower layer) 240, and an electrically conducting film (not shown) of a three-layer structure is formed sandwiching the aluminum alloy layer (aluminum film to which 1% by weight of titanium is added) by titanium films. The electrically conducting film is then patterned to form source wirings 242 and 243 and drain wiring 244 of the CMOS circuit, and to form source wiring 245 and drain wiring 246 of the pixel TFT. Concerning the pixel TFT, the source wiring and the drain wiring are alternately interchanged.

After the source wirings and the drain wirings are formed as described above, a silicon nitride film is formed maintaining a thickness of 300 nm as a passivation film 247, followed by the hydrogenation treatment at 300° C. for one hour. The hydrogenation treatment is for exposing to hydrogen excited by heat or plasma. In this step, hydrogen emitted from the passivation film 247 and hydrogen contained in large amounts in the first interlayer insulating film (lower layer) 240 diffuse downward due to the hydrogenation (do not diffuse upward being blocked by the passivation film 247), and the active layer is terminated with hydrogen.

As the passivation film 247, there can be used a silicon oxynitride film, a silicon oxide film or a laminated film of these silicon-containing insulting films in addition to the silicon nitride film. In this embodiment, further, the plasma treatment is effectively conducted using a hydrogen-containing gas (typically, an ammonia gas) as a pretreatment for forming the passivation film 247. Owing to the pretreatment, hydrogen activated (excited) by the plasma is confined by the passivation film 247. Upon effecting the hydrogenation treatment, the hydrogenation efficiency is very improved.

By adding a nitrous oxide gas in addition to the hydrogen-containing gas, further, the surface of the material to be treated is washed by water that is formed, making it possible to effectively prevent contamination due to boron and the like contained in the open air.

After the hydrogenation treatment, the passivation film 247 is removed from the drain wiring 246 to form an opening 248. Next, an acrylic film is formed maintaining a thickness of 1 μm as the second interlayer-insulating film 249. There can be used such resin films as polyimide, polyamide, polyimideamide or BCB (benzocyclobutene) or the like in addition to acryl. Here it is desired to maintain a sufficient degree of flatness.

Then, a light-shielding film 250 which is an aluminum film is formed on the second interlayer-insulting film 249 by sputtering. The light-shielding film is formed of a material that satisfies such conditions that (1) an oxide thereof is easily formed on the surface, (2) the oxide has a high dielectric constant and a high breakdown voltage, and (3) it exhibits light-shielding property to a sufficient degree. In this sense, it can be said that the aluminum film or the aluminum alloy film is most suited.

In this embodiment, a high-purity aluminum film (five nine) is used to, first, form the light-shielding film maintaining a thickness of 135 nm. In this case, the light-shielding film 250 is formed so as to conceal the source wiring and gate wiring of the pixel TFT and to conceal the TFT body, and is formed like a matrix on the pixel unit. Here, a contact portion where the drain wiring will be electrically connected to the pixel electrode in a subsequent step is maintained opened without forming the light-shielding film therein.

In this embodiment, further, the surface of the second interlayer-insulating film 249 is plasma-treated by using a $CF_4$ gas as a pretreatment for forming the light-shielding film 250. Due to this treatment, the adhesion is enhanced between the light-shielding film 250 which is the aluminum film and the second interlayer-insulating film 249 which is the resin film.

Figure 5A:
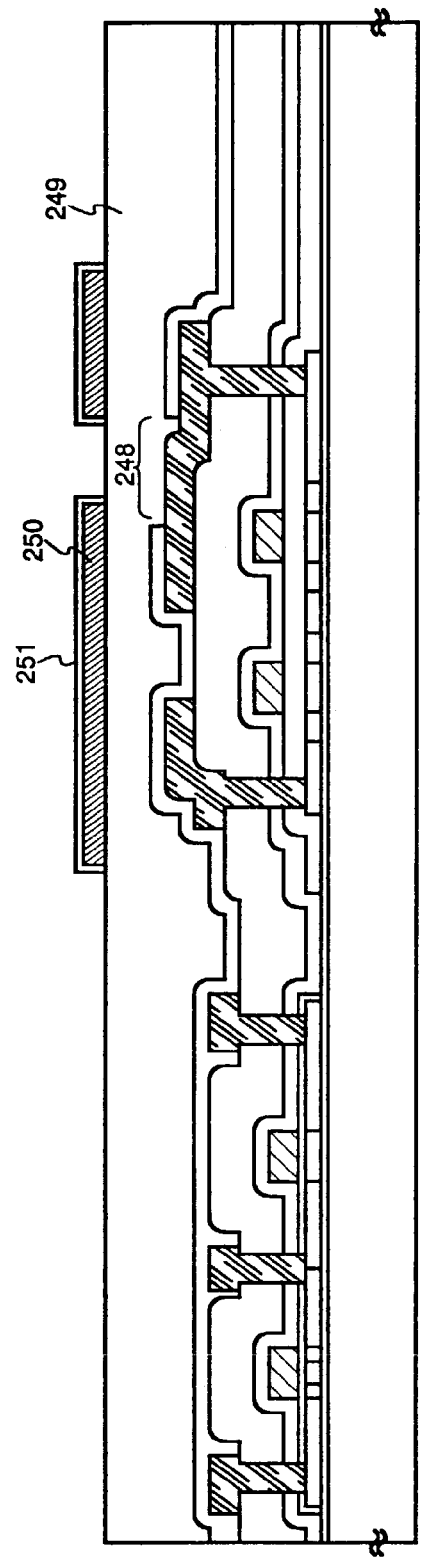
FIGS. 5A and 5B are views illustrating the steps for manufacturing the AM-LCD.

Next, the light-shielding film 250 is anodically oxidized to form an anodic oxide 241 on the surface (FIG. 5A).

This embodiment uses a formation solution of a mixture of a 15% ammonium tartarate solution and an ethylene glycol solution at a ratio of 2 to 8. Then, the substrate is immersed in the solution maintained at 10° C., and a formation current (60 $mA/cm^2$ in this embodiment) is supplied to effect the anodic oxidation. After the formation voltage has reached 35 V, this voltage is maintained constant for 15 minutes to complete the anodic oxidation.

Thus, the anodic oxide (alumina in this embodiment) is formed maintaining a thickness of about 50 nm on the surface of the light-shielding film 250. Therefore, the light-shielding film 250 finally possesses a thickness of 150 nm.

The second-layer insulating film 249 is etched on the inside of a gap in the light-shielding film in the contact portion between the drain wiring and the pixel electrode, thereby to form a contact hole (contact portion) 252 reaching the drain wiring 246. Then, a pixel electrode 253 which is a transparent electrically conducting film (ITO film in this embodiment) is formed thereon maintaining a thickness of 100 nm (FIG. 5B).

Here, the region 254 where the pixel electrode 253 is overlapped on the light-shielding film 250 works as a storage capacitor. Since the alumina film which is the dielectric has a thickness of as small as about 50 nm and a dielectric constant of as high as 8 to 9, there can be formed a large capacity.

The portion where the contact hole (contact portion) 252 is formed is a gap in the light-shielding film 250 and does not shield light. However, light is completely shielded by the underlying drain wiring 246, and there arouses no problem. It is therefore desired that the contact hole (contact portion) 252 is formed on the inside maintaining a margin of at least 0.5 μm (preferably, 1 μm) from the end of the drain wiring 246.

Figure 5B:
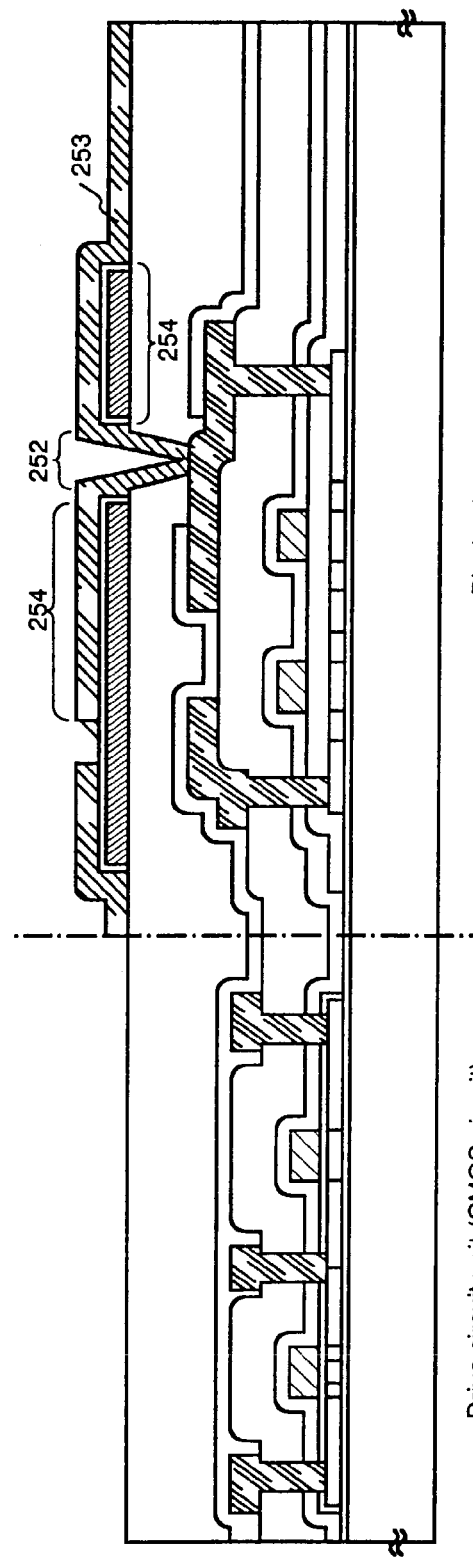

Thus, the active matrix substrate is completed having a structure as shown in FIG. 5B. Thereafter, the AM-LCD shown in FIG. 1 is fabricated through the known steps of assembling the cells.

The AM-LCD of the invention has several structural features, and exhibits very high operation performance and reliability due to synergistic effects thereof. One of the structural features is that the gate-insulating film has different thicknesses between the drive circuit unit and the pixel unit that formed on the same substrate. Typically, the drive TFTs in part (circuit that must operate at high speeds) of the drive circuit unit has the gate-insulating film of a thickness smaller than that of the pixel TFTs.

Thus, the TFTs having a very high electric-field effect mobility can be arranged in the circuit that must operate at high speeds to satisfy the circuit requirements to a sufficient degree. Then, the TFTs that give importance to the breakdown voltage characteristics rather than the operation speed are arranged in the circuits (pixel unit, buffer circuit, analog switching circuit, etc.) that require a high gate-insulating breakdown voltage.

This does not mean that the thickness of the gate-insulating film must not be the same between the drive circuit unit and the pixel unit. There exists a trade-off relationship between the operation speed and the gate-insulating breakdown voltage, and the above structure is desired in the above-mentioned case.

Another feature is that an ordinary LDD structure is employed for the circuit that gives importance for decreasing the off current like in the pixel unit, and an LDD region overlapped on the gate wiring like the so-called GOLD structure, is arranged in the circuit that gives importance for coping with the hot carriers like in the drive circuit unit. This makes it possible to arrange the TFTs having a sufficient degree of reliability to meet the circuit performance.

A further feature resides in the use of the oxide of the light-shielding film as a dielectric for forming the storage capacity using the light-shielding film and the pixel electrode. A feature also resides in the use of an aluminum film or a film comprising chiefly aluminum as the light-shielding film. This makes it possible to maintain a large capacity with a very small area and, hence, to increase the effective display area of the pixel (to increase the numeral aperture).

According to the manufacturing steps of the embodiment, the final active layer (semiconductor layer) of the TFT is formed of a crystalline silicon film of a particular crystalline structure having continuity in the crystal lattice. Features will now be described.

As a first feature, the crystalline silicon film formed according to the manufacturing steps of the embodiment has a crystalline structure in which a plurality of needle-like or rod-like crystals (hereinafter simply abbreviated as rod-like crystals) are collected and arranged if viewed microscopically. This is easily confirmed by an observation based on the TEM (transparent-type electron microscopic method).

As a second feature, a plane {110} can be confirmed, by utilizing electron ray diffraction, as a main orientation plane in which the crystal axis is deviated to some extent in the surface (channel-forming portion) of the crystalline silicon film formed according to the production steps of the embodiment. This is confirmed from the fact that diffraction spots are appearing having a particular regularity on the plate {110} when the electron ray diffraction photograph having a spot diameter of about 1.35 μm is observed. It is further confirmed that the spots are distributed in a concentric manner.

As a third feature, it is confirmed that the orientation ratio of the plane {220} is not smaller than 0.7 (typically, not smaller than 0.85) if the orientation ratio is calculated by using the X-ray diffraction method (strictly, by using the X-ray diffraction method based on the θ-2θ method). Here, the orientation ratio is calculated according to a method disclosed in Japanese Patent Laid-Open No. 7-321339.

As a fourth feature, the present applicant has confirmed the continuity in the crystalline lattice on the crystalline grain boundary by observing the crystalline grain boundary formed by the rod-like crystals that are contacting to each other based on the HR-TEM (high-resolution transmission-type electron microscopic method). This can be easily confirmed from the fact that the observed crystal lattices are continuing on the crystalline grain boundaries.

The continuity of the crystalline lattice on the crystalline grain boundaries stems from the crystalline grain boundary which is the so-called "planar grain boundary". In this specification, the plane granular boundary is as defined in "Characterization of High-Efficiency Cast-Si Solar Cell Wafers by MBIC Measurement, Ryuichi Shimokawa and Yutaka Hayashi, Japanese Journal of Applied Physics, Vol. 27, No. 5, pp. 751-758, 1988".

According to the above paper, the planar grain boundary includes twin grain boundaries, special laminate defects and special twisted grain boundaries. The planar grain boundary has a feature in that it is electrically inactive. That is, despite it is a crystalline grain boundary, the planar grain boundary does not exhibit a trapping function for hindering the migration of carriers and can, hence, be regarded to be not substantially existing.

In particular, when the crystal axis (axis perpendicular to the crystal surface) is an {110} direction, the twin grain boundary {211} is also called a corresponding grain boundary of $\Sigma 3$. The value $\Sigma$ is a parameter indicating the degree of matching of the corresponding grain boundary, and it has been known that the matching increases with a decrease in the value $\Sigma$. In the crystalline grain boundary formed between the two crystalline grains, for example, it has been known that when the plane azimuths of the two crystals are {110} and when the angle subtended by the lattice stripes corresponding to a plane {111} is denoted by θ, then, the corresponding grain boundary of $\Sigma 3$ is obtained when θ=70.5°.

In the crystalline silicon film formed according to the embodiment, when the crystalline grain boundary formed between the two crystalline particles is observed based on the HR-TEM, the lattice stripe of the neighboring crystalline particles is continuing, in many cases, at an angle of about 70.5°. It is, therefore, estimated that the crystalline grain boundary is the corresponding grain boundary of $\Sigma 3$, i.e., the twin grain boundary {211}.

This crystalline structure (correctly, structure of a crystalline grain boundary) indicates that two different crystalline grains are joined together maintaining very good matching on the crystalline grain boundary. That is, the crystal lattices are continuing on the crystalline boundary very suppressing the trapping level that stems from crystalline defects or the like. Therefore, it can be regarded that the crystalline grain boundary does not substantially exist in the semiconductor thin film having such a crystalline structure.

It has further been confirmed by the TEM observation that most of defects existing in the crystalline particles are extinguished by the heat treatment at a temperature of as high as from 700 to 1150° C. (thermal oxidation step or gettering step in this embodiment). This is obvious from the fact that the number of defects are greatly decreasing before and after the step of heat treatment.

The difference in the number of defects appear as a difference in the spin density through the electron spin resonance analysis (ESR). At present, it has been learned that the crystalline silicon film formed through the manufacturing steps of the embodiment has a spin density of at least not larger than $5 \times 10^{17}$ spins/cm$^3$ (preferably not larger than $3 \times 10^{17}$ spins/cm$^3$). However, this measured value is close to a limit that can be detected by the existing measuring apparatus and it is expected that the practical spin density may be lower than the above value.

As described above, the crystalline grain boundary does not substantially exist in the crystalline silicon film formed by the embodiment. Therefore, the crystalline silicon film may be considered to be a single crystalline silicon film or a substantially single crystalline silicon film.

(Knowledge Concerning Electric Characteristics of the TFT)

The TFT (having the same structure as the CMOS circuit shown in FIG. 1) prepared according to this embodiment exhibits electric properties comparable to those of the MOSFET. The following data are obtained from the TFT (the active layer has a thickness of 35 nm and the gate-insulating film has a thickness of 80 nm) prepared by the present applicant on a trial basis.

The sub-threshold coefficient which is an indication of the switching performance (swiftness of the switching on/off operation) is as small as from 80 to 150 mV/decade (typically, from 100 to 120 mV/decade) for both the N-channel TFT and the P-channel TFT.

The electric-field effect mobility ($\mu_{FE}$) which is an indication of the operation speed of the TFT is as large as from 150 to 650 cm$^2$/Vs (typically, from 200 to 500 cm$^2$/Vs) for the N-channel TFT, and from 100 to 300 cm$^2$/Vs (typically, from 120 to 200 cm$^2$/Vs) for the P-channel TFT.

The threshold voltage ($V_{th}$) which is an indication of the drive voltage of the TFT is as small as from −0.5 to 1.5 V for the N-channel TFT and from −1.5 to 0.5 V for the P-channel TFT. As described above, it has been confirmed that very excellent switching characteristics and high-speed operation characteristics are realized.

Embodiment 2

In the embodiment 1, the light-shielding film 250 may be maintained at a common potential or may be floated. There will be no problem when it is floated. When pulled down to the common potential, however, a connection terminal is necessary for pulling the light-shielding film down to the common potential. This embodiment deals with this structure with reference to FIGS. 7A and 7B.

Figure 7A:
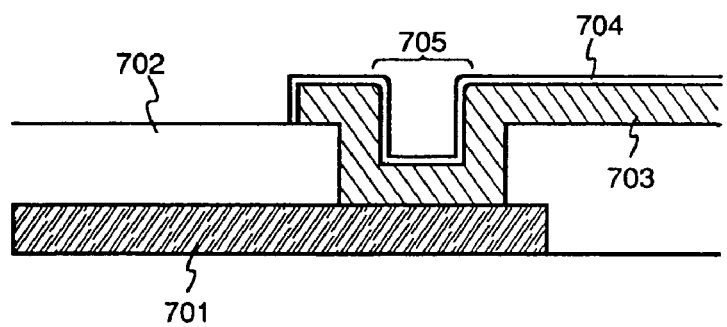
FIGS. 7A and 7B are views illustrating the structure of a common potential-drawing terminal.

In FIG. 7A, reference numeral 701 is a common source feeder line which is a wiring formed simultaneously with the source wiring and the drain wiring. Further, reference numeral 702 denotes a second interlayer-insulating film, 703 denotes a light-shielding film, and 704 denotes an anodic oxide.

In this case, prior to forming the light-shielding film 250 through the step of FIG. 5A, a contact hole (contact portion) 705 (FIG. 7A) may be formed in the second interlayer-insulating film 249 (corresponds to 702 in FIG. 7A) and, then, the light-shielding film 250 (corresponds to 703 in FIG. 7A) may be formed. Thus, the light-shielding film 703 can be easily maintained at the common potential.

Figure 7B:
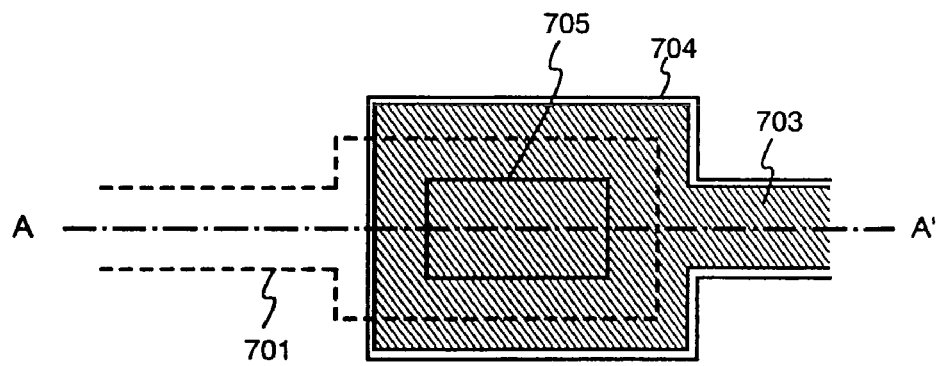

FIG. 7B illustrates this state that is viewed from the upper surface. FIG. 7A is a sectional of the upper plan view of FIG. 7A along the line A-A'. Reference numerals should be referred to those shown in FIG. 7A. This embodiment is one of the examples of the embodiment 1, and the conditions of the manufacturing steps should be referred to those of the embodiment 1.

Embodiment 3

Figure 8A:
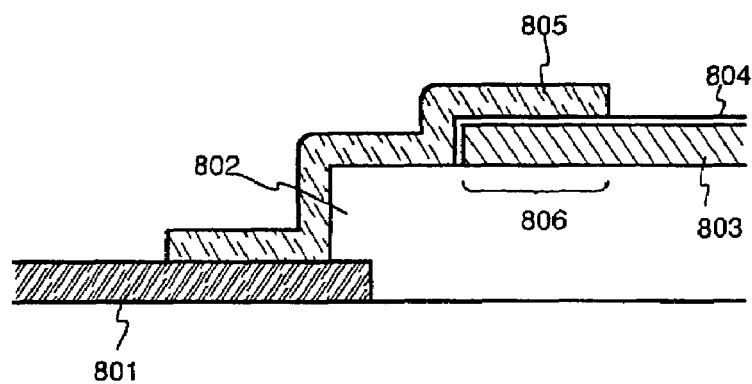
FIGS. 8A and 8B are views illustrating the structure of a common potential-drawing terminal.
Figure 8B:
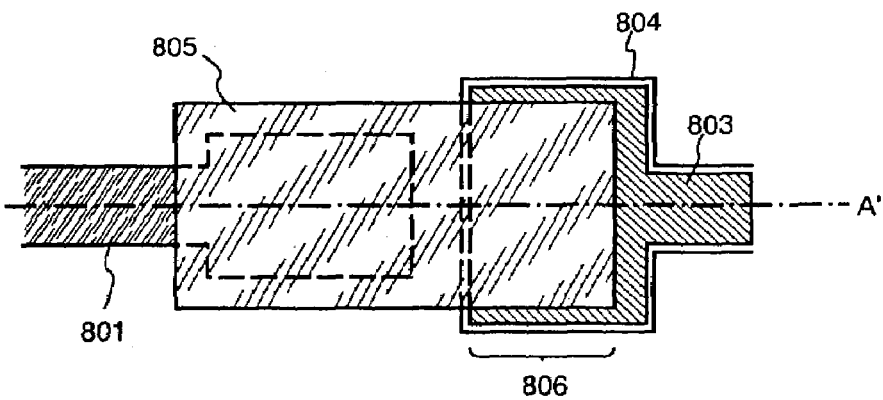

This embodiment is another example of the embodiment 2. The structure of this embodiment is shown in FIGS. 8A and 8B. In FIG. 8A, reference numeral 801 denotes a common power feeder line which is a wiring formed simultaneously with the source wiring and the drain wiring. Reference numeral 802 denotes a second interlayer-insulating film, 803 denotes a light-shielding film, 804 denotes an anodic oxide and 805 denotes a transparent electrically conducting film formed simultaneously with the pixel electrode.

Here, in forming the contact hole (contact portion) 252 in the second interlayer-insulating film 249 through the step of FIG. 5B, the second interlayer-insulating film 802 is partly removed at the connection terminal portion to expose the common power feeder line 801 as shown in FIG. 8A. Then, a transparent electrically conducting film 805 is formed on the connection terminal portion simultaneously with the formation of the pixel electrode 253.

In this case, the anodic oxide 804 exists between the light-shielding film 803 and the transparent electrically conducting film 805 to form a capacitor 806. When the AC drive is taken into consideration, however, it can be regarded that the capacitor 806 is substantially short-circuited, and the light-shielding film 803 and the common power feeder line 801 are electrically connected together.

FIG. 8B illustrates this state as viewed from the upper surface. FIG. 8A is a sectional view of the upper plan view of FIG. 8B along the line A-A'. Reference numerals should be referred to those of FIG. 8A. This embodiment is one of the examples of the embodiment 1, and the conditions of the manufacturing steps should be referred to those of the embodiment 1.

Embodiment 4

In FIG. 1, a capacitive coupling takes place between the light-shielding film 130 and an opposing electrode 136 on the side of the opposing substrate, with the liquid crystal 134 as a dielectric (strictly speaking, the alignment films 133 and 135 and oxide 131 are also included). When the capacitive coupling is large, therefore, the light-shielding film 130 is maintained at the common potential due to the effect of coupling.

That is, the light-shielding film 130 can be maintained at the common potential due to the capacitive coupling to the opposing electrode without connecting any other wiring. In this embodiment, the light-shielding film 130 is thus maintained at the common potential. This embodiment is one of the examples of the embodiment 1, and the conditions of the manufacturing steps should be referred to those of the embodiment 1.

Embodiment 5

This embodiment concretely explains the TFTs of what structure be arranged in what circuit with reference to FIGS. 9A to 9D.

The AM-LCD has a minimum required operation voltage (power-source voltage) that differs depending on the circuit. In the pixel unit, for example, the operation voltage ranges from 14 to 20 V by taking into consideration the voltage applied to the liquid crystals in the pixel unit and the voltage for driving the pixel TFTs. Therefore, the TFTs must be capable of withstanding the application of such high voltages.

The shift resister circuit used for the source drive circuit and the gate drive circuit needs have an operation voltage of from about 5 to about 10 V at the highest. The lower voltage offers compatibility to the external signals and suppresses the consumption of electric power. However, the high breakdown voltage-type TFT operates at a low speed though it exhibits favorable breakdown voltage characteristics, and is not suited for a circuit that must operate at high speeds, such as a shift register circuit.

Thus, the circuits formed on the substrate are divided into those circuits that use the TFTs giving importance to the breakdown voltage characteristics and those circuits that use the TFTs giving importance to the operation speed.

Figure 9A:
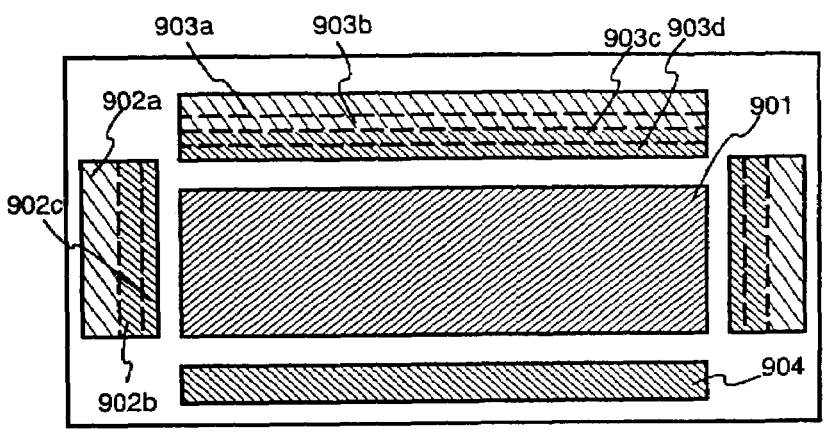
FIGS. 9A to 9D are views illustrating the block constitution and circuit arrangement of the AM-LCD.

FIGS. 9A to 9D concretely illustrates the constitution of this embodiment. FIG. 9A is a block diagram of the AM-LCD of when it is viewed from the upper side. Reference numeral 901 denotes a pixel unit. Each pixel includes a pixel TFT and a storage capacity, and functions as a display unit. Reference numeral 902a denotes a shift register circuit, 902b denotes a level shifter circuit, and 902c denotes a buffer circuit. These circuits as a whole forms a gate-drive circuit unit.

In the AM-LCD shown in FIG. 9A, the gate-drive circuit units are provided with the pixel unit being sandwiched therebetween, and have the same gate wiring, respectively. That is, redundancy is provided such that even in case defect occurs in either one gate driver, a voltage is applied to the gate wiring.

Reference numeral 903a denotes a shift register circuit, 903b denotes a level shifter circuit, 903c denotes a buffer circuit, and 903d denotes a sampling circuit. These circuits as a whole form a source-drive circuit. A precharging circuit 904 is provided on the side opposite to the source-drive circuit with the pixel unit sandwiched therebetween.

In the thus constituted AM-LCD, the shift register circuits 902a and 903a are the circuits that must operate at high speeds, operate at a voltage of as low as from 3.3 to 10 V (typically, from 3.3 to 5 V), and do not require particularly high breakdown voltage characteristics. It is therefore desired that the gate-insulating film has a thickness of as small as from 5 to 50 nm (preferably, from 10 to 30 nm).

Figure 9B:
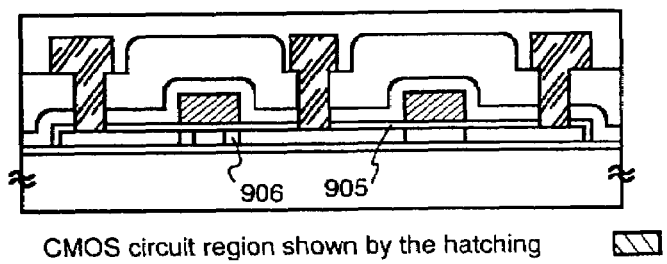

FIG. 9B is a schematic view of the CMOS circuit chiefly used for the circuit that must operate at high speeds, like the shift register and the signal-dividing circuit. In FIG. 9B, reference numeral 905 denotes a gate-insulating film having a thickness of as small as from 5 to 50 nm (preferably, from 10 to 30 nm).

It is further desired that the LDD region 906 has a length of from 0.1 to 1 μm (typically, from 0.3 to 0.5 μm). When the operation voltage is as sufficiently low as from 2 to 3 V, the LDD region may not be provided. The LDD region is completely overlapped on the gate wiring to prevent deterioration caused by hot carriers, as a matter of course.

Figure 9C:
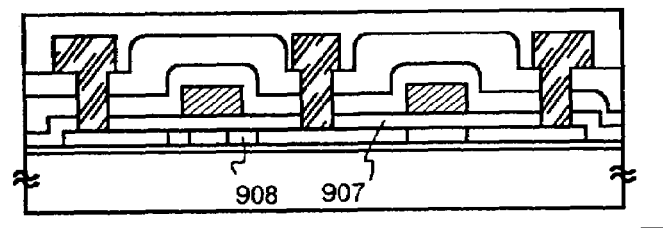

Next, the CMOS circuit shown in FIG. 9C is chiefly adapted to level shifter circuits 902b and 903b, buffer circuits 902c, 903c, sampling circuit 903d and precharging circuit 904. These circuits must flow heavy currents and operate at voltages as high as from 14 to 16 V. On the gate driver side, in particular, an operation voltage of as high as 19 V may often be required. Therefore, the TFTs having very good breakdown voltage characteristics (high breakdown voltage characteristics) must be used.

In the CMOS circuit shown in FIG. 9C, the thickness of the gate-insulating film 907 is selected to be from 50 to 200 nm (desirably, from 100 to 150 nm). In the circuit that requires a high gate-insulating breakdown voltage, it is desired that the gate-insulating film has a thickness larger than that of the TFTs in the shift register circuit.

It is desired that the LDD region 908 has a length of from 1 to 3 μm (typically, from 1.5 to 2 μm). A portion of the LDD region overlapped on the gate wiring may have a length of from 0.5 to 2 μm (preferably, from 1 to 1.5 μm). The remainder of the LDD region is not overlapped on the gate wiring. Arrangement of such a region makes it possible to effectively suppress the off current. The CMOS circuit shown in FIG. 9C receives a high voltage comparable to that applied to the pixel like the buffer circuit. It is therefore desired that the LDD region has a length comparable to, or close to, that of the pixel.

Figure 9D:
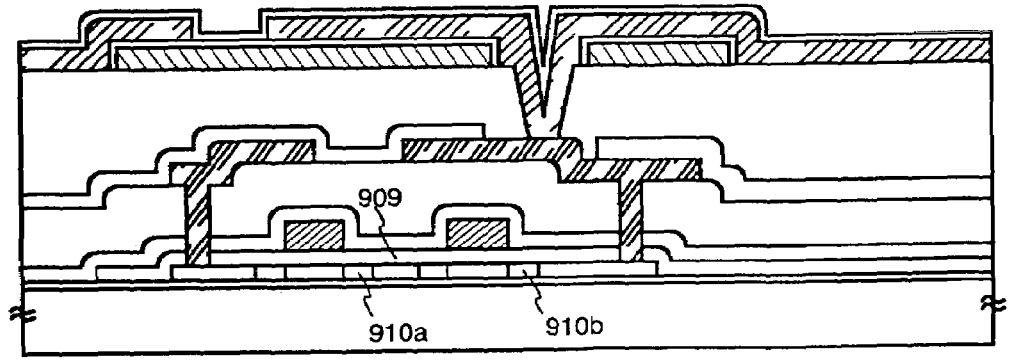

FIG. 9D is a view schematically illustrating the pixel unit 901. The pixel TFT requires an operation voltage of from 14 to 16 V since it is added up with a voltage applied to the liquid crystal. Further, the electric charge stored in the liquid crystal and in the storage capacity must be maintained for a period of one frame and, hence, the off current must be as small as possible.

On account of these reasons in this embodiment, the double-gate structure is employed by using the NTFTs, and the thickness of the gate-insulating film 909 is selected to be from 50 to 200 nm (preferably, from 100 to 150 nm). This film thickness may be the same as, or different from, the thickness of the film in the CMOS circuit shown in FIG. 9C.

It is further desired that the LDD regions 910a and 910b have a length of from 2 to 4 μm (typically, from 2.5 to 3.5 μm). The pixel TFT shown in FIG. 9D has a feature in that the LDD regions 910a and 910b are not overlapped on the gate wiring, since the off current must be decreased as much as possible.

Even with reference to the AM-LCD as described above, a variety of circuits are often provided on the same substrate, and different operation voltages (power-source voltages) are required by the circuits. In such a case, the TFTs having gate-insulating films of different thicknesses must be arranged depending on the circuits as in this invention.

The circuit shown in the embodiment 1 is effective in realizing the constitution of this embodiment.

Embodiment 6

Figure 10:
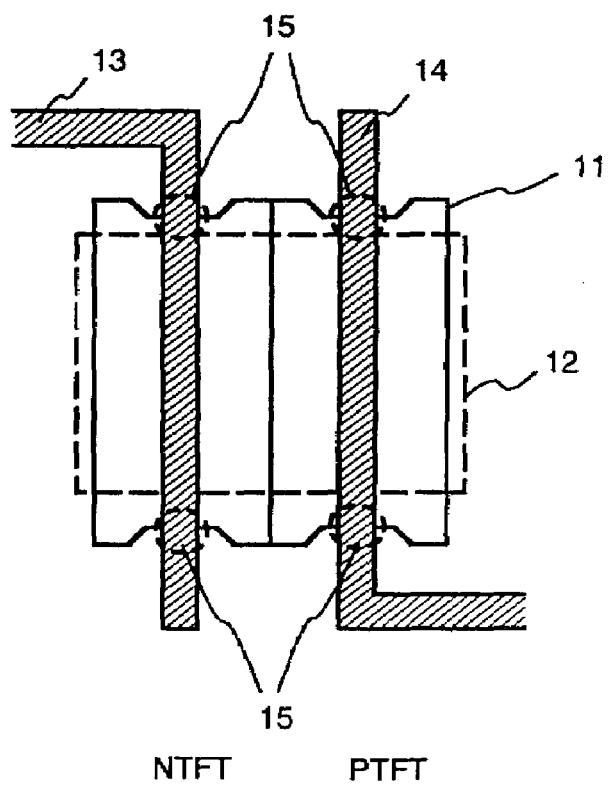
FIG. 10 is a view illustrating the structure of a drive TFT (CMOS circuit)

In conducting the step for selectively removing the gate-insulating film in the embodiment 1, it is desired that the removal from the region where the drive TFT is to be formed is conducted in a manner as shown in FIG. 10. In FIG. 10, reference numeral 11 denotes an active layer, 12 denotes an end of the gate-insulating film, and 13 and 14 denote gate wirings. As shown in FIG. 10, it is desired to leave the gate-insulating film at an end of the active layer 11 on a portion 15 where the gate wiring rides over the active layer 11.

A phenomenon called edge thinning occurs at the end of the active layer 11 in a subsequent step of thermal oxidation. This is the phenomenon in which the oxidation reaction so proceeds as to dive under the end of the active layer, causing the end to become thin and swell upward. Therefore, the edge-thinning phenomenon arouses a problem in that the gate wiring breaks down when it rides over.

When the gate-insulating film is removed so as to establish the structure as shown in FIG. 10, however, the edge-thinning phenomenon is prevented from occurring at a portion 15 where the gate wiring rides over. This makes it possible to prevent in advance the problem of breakage of the gate wiring. The constitution of this embodiment can be effectively used for the embodiment 1.

Embodiment 7

This embodiment deals with the case where the AM-LCD is really manufactured by forming the TFTs on the substrate through the manufacturing steps shown in the embodiment 1.

After the state of FIG. 5B is obtained, the alignment film is formed maintaining a thickness of 80 nm on the pixel electrode 253. Next, the opposing substrate is prepared by forming a color filter, a transparent electrode (opposing electrode) and alignment films on a glass substrate. Then, the alignment films are rubbed, and the substrate on which the TFTs are formed is stuck to the opposing substrate using a sealing member. Liquid crystals are held therebetween. The cells can be fabricated by using known means which is not described here in detail.

The spacer may be provided as required for maintaining a cell gap. Therefore, the spacer may not be particularly provided when the cell gap can be maintained like in the AM-LCD of a diagonal of not larger than an inch.

Figure 11:
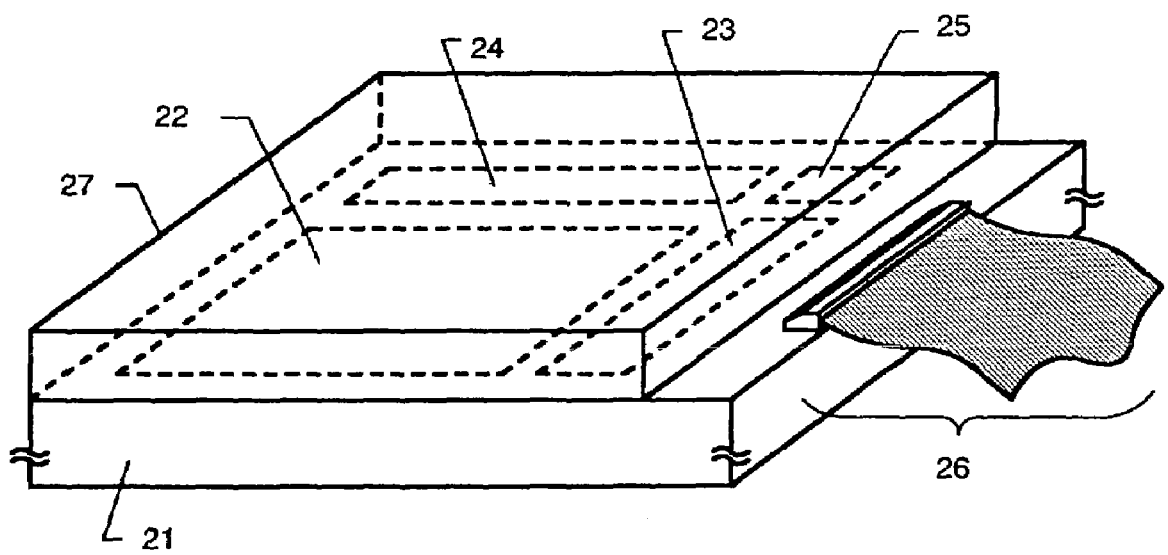
FIG. 11 is a view illustrating the appearance of the AM-LCD.

FIG. 11 shows the appearance of the thus manufactured AM-LCD. On the active matrix substrate (the one in which the TFTs are formed) 21 are formed the pixel unit 22, source drive circuit 23, gate drive circuit 24, and signal processing circuit (signal-dividing circuit, D/A converter circuit, γ-correction circuit, differential amplifier circuit, etc.) 25, and to which is attached an FPC (flexible printed circuit) 26. Reference numeral 27 denotes an opposing substrate.

This embodiment can be combined with any one of the embodiments 1 to 6.

Embodiment 8

This embodiment deals with the case where another means is employed for forming the crystalline silicon film in the embodiment 1.

Concretely speaking, technique disclosed in the embodiment 2 of Japanese Patent Laid-Open No. 7-130652 (corresponds to U.S. Pat. No. 5,643,826) is employed for crystallizing the amorphous silicon film. The technique disclosed in this application is the one according to which a catalytic element (typically, nickel) for promoting the crystallization is selectively held on the surface of the amorphous silicon film, and this portion is crystallized as a seed for growing the nuclei.

According to this technique, particular directivity can be imparted to the growth of crystals making it possible to form a highly crystalline silicon film.

It is also possible to form an insulating masking film for selectively holding the catalytic element, for masking phosphorus that is added for gettering. This makes it possible to decrease the number of the steps. This technique has been closely disclosed in Japanese Patent Laid-Open No. 10-247735 filed by the present applicant.

The constitution of this embodiment can be freely combined with the constitution of any one of the embodiments 1 to 7.

Embodiment 9

Phosphorus is used for gettering nickel (catalytic element used for crystallizing the silicon film) described in the embodiment 1. This embodiment deals with the case where nickel is gettered by using another element.

First, the state of FIG. 2B is obtained according to the step of the embodiment 1. In FIG. 2B, reference numeral 204 denotes a crystalline silicon film. In this embodiment, however, the concentration of nickel used for the crystallization is suppressed to be as low as possible. Concretely speaking, a layer containing nickel in an amount of from 0.5 to 3 ppm reckoned as weight is formed on the amorphous silicon film, and the heat treatment is effected for crystallization. The nickel concentration in the thus formed crystalline silicon film is from $1\times10^{17}$ to $1\times10^{19}$ atoms/cm$^3$ (typically, from $5\times10^{17}$ to $1\times10^{18}$ atoms/cm$^3$).

After the crystalline silicon film is formed, the heat-treatment is conducted in an oxidizing atmosphere containing halogen element. The temperature is from 800 to 1150° C. (preferably, from 900 to 1000° C.) and the treating time is from 10 minutes to 4 hours (preferably, from 30 minutes to one hour).

In this embodiment, the heat treatment is conducted at 950° C. for 30 minutes in an atmosphere, i.e., in an oxygen atmosphere containing 3 to 10% by volume of hydrogen chloride.

Through this step, nickel is released from the crystalline silicon film as volatile nickel chloride into the treating atmosphere. That is, nickel is removed by the gettering action of a halogen element. When the nickel concentration existing in the crystalline silicon film is too high, however, there arouses a problem in that the oxidation abnormally proceeds on a portion where nickel has segregated. Therefore, the concentration of nickel must be suppressed to be as low as possible in the step of crystallization.

The constitution of this embodiment can be freely combined with any one of the constitutions of the embodiments 1 to 8.

Embodiment 10

This embodiment deals with the case where the CMOS circuit and the pixel unit shown in the embodiment 1 have different structures. Concretely speaking, the arrangement of the LDD region is differed depending upon the specifications required by the circuits.

The basic structures of the CMOS circuit and the pixel unit were shown already in FIG. 1. Therefore, this embodiment describes required portions only by attaching reference numerals thereto. As for the TFT structure of this embodiment, further, reference should basically be made to the manufacturing method of the embodiment 1.

Figure 12A:
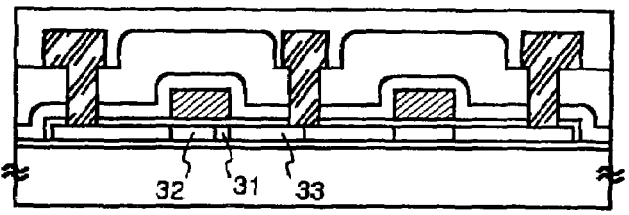
FIGS. 12A and 12B are views illustrating the structure of a CMOS circuit in cross section.

First, the circuit shown in FIG. 12A has a feature in that the LDD region 31 of NTFT is provided being contacted to the channel-forming region 32 of the side of the drain region 33 only in the CMOS circuit. This structure is realized by concealing the side of the source region with the resist mask.

The CMOS circuit used for the drive circuit unit must operate at a high speed and, hence, the resistance component that could decrease the operation speed must be excluded as much as possible. However, the LDD region necessary for enhancing resistance against the hot carriers works as a resistance component, sacrificing the operation speed.

However, the hot carriers are poured at an end of the channel-forming region on the side of the drain region, and the countermeasure against the hot carriers is sufficient if there exists the LDD region at that portion being overlapped on the gate wiring. Therefore, the LDD region needs not be provided to an excess degree at an end of the channel-forming region on the side of the source region.

The structure of FIG. 12A cannot be adapted for the case where the source region and the drain region are interchanged like the pixel TFT. In the case of the CMOS circuit, the source region and the drain region are usually secured, and the structure of FIG. 12A can be realized.

Figure 12B:
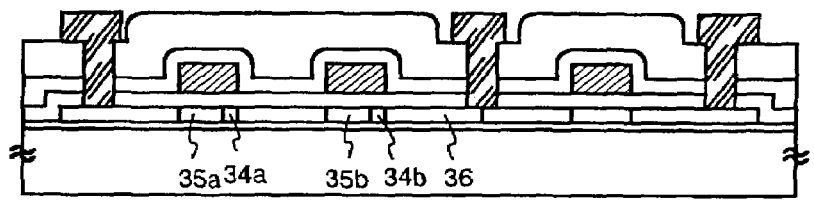

Next, the circuit shown in FIG. 12B shows the case where the NTFT has the double-gate structure and the PTFT has the single-gate structure in the CMOS circuit. This structure is used for the drive circuit unit (typically, buffer circuit or sampling circuit) that requires a high breakdown voltage).

In this case, a feature resides in that the LDD regions 34a and 34b of NTFT are provided by the sides of the channel-forming regions 35a and 35b on the side of the drain regions 36 (or on the side close to the drain regions 36).

Upon employing this structure, no resistance component is contained in the LDD regions on the side of the source regions. Further, the double-gate structure disperses and relaxes the electric field across the source and the drain.

The constitution of this embodiment can be freely combined with any one of the constitutions of the embodiments 1 to 9.

Embodiment 11

In the embodiment 1, providing the light-shielding film under the TFT (concretely speaking, under the active layer), as required, is effective in suppressing the leakage of current caused by optical excitation. In particular, the light-shielding film is effective when it is provided under the pixel TFT for which the leakage of current (or off current) must be suppressed as much as possible.

As the light-shielding film, there can be used a metal film or a black resin film. When the metal film is used, a storage capacity can be formed between the light-shielding film and the active layer. In this case, a net of two storage capacitors are connected in parallel, making it possible to obtain a sufficient amount of storage capacity.

The constitution of this embodiment can be freely combined with any one of the constitutions of the embodiments 1 to 10.

Embodiment 12

This embodiment offers technique for enhancing the adhesion between the light-shielding film and the underlying second interlayer-insulating film (resin film) in the pixel unit shown in the embodiment 1.

Figure 13:
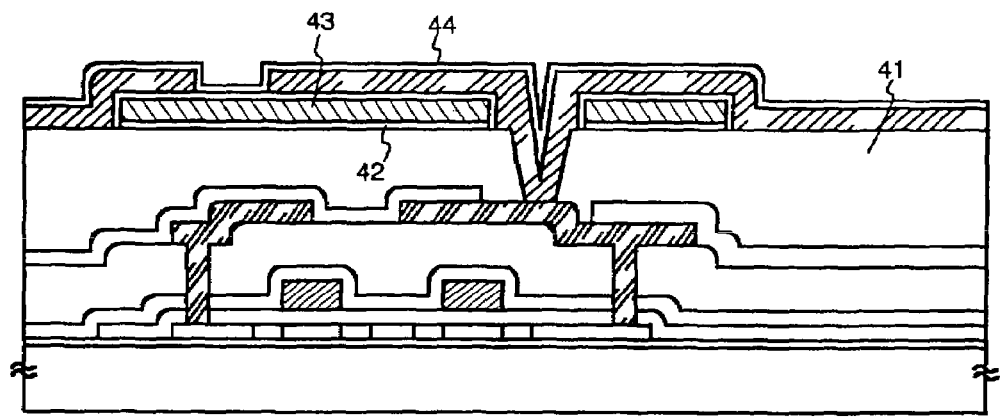
FIG. 13 is a view illustrating the structure of a pixel unit in cross section.

In this embodiment, after the second interlayer-insulating film 41 of acrylic film is formed, a silicon oxide film is formed maintaining a thickness of from 10 to 30 nm by sputtering and, then, an aluminum film of a high purity is continuously formed. This film is etched at one time to form the light-shielding film. In FIG. 13, reference numeral 42 is a silicon oxide film, and 43 is an aluminum film of a high purity.

The silicon oxide film 42 works as a buffer layer for improving adhesion between the second interlayer-insulating film 41 which is the acrylic film and the light-shielding film 43 which is the aluminum film of a high purity. Upon providing the silicon oxide film 42, a favorable adhesion is maintained even when the oxide 44 is formed by the anodic oxidation method.

The constitution of this embodiment can be freely combined with any one of the constitutions of the embodiments 1 to 11.

Embodiment 13

Figure 14A:
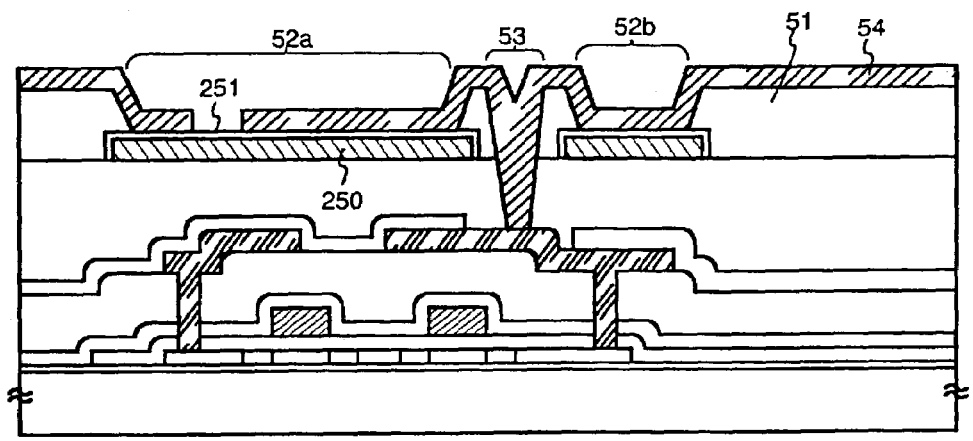
FIGS. 14A and 14B are views illustrating the structure of a pixel unit in cross section.
Figure 14B:
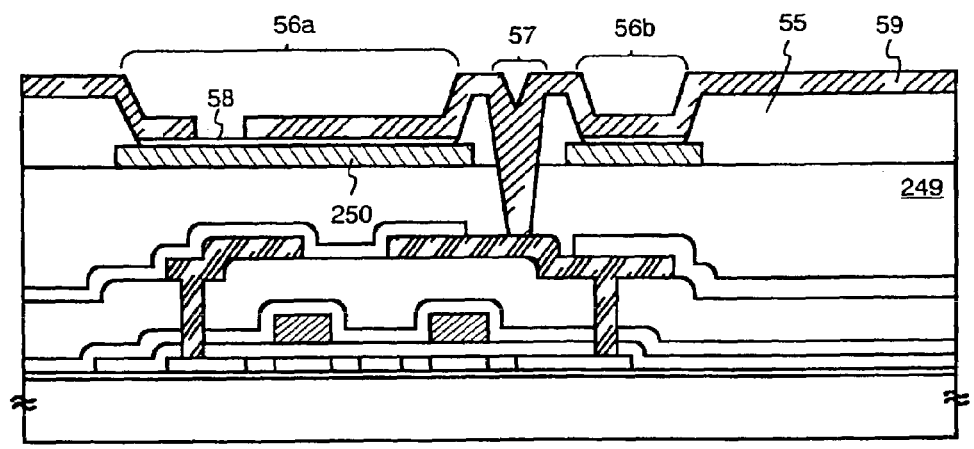

This embodiment deals with the case where the storage capacitor has a structure different from that of FIG. 1. Reference is made to FIGS. 14A and 14B.

In FIG. 14A, first, the state of FIG. 5A is obtained according to the steps of the embodiment 1. Next, the third interlayer-insulating film 51 is formed by using the resin film (acrylic film in this embodiment), and openings 52a and 52b are formed therein. Upon forming the openings 52a and 52b, the light-shielding film 250 (strictly, an oxide 251 on the surface thereof) is exposed. Here, the contact hole 53 is also formed simultaneously.

Thereafter, the pixel electrode 54 which is an ITO film is formed. Thus, storage capacitors are formed by the light-shielding film 250, oxide 251 of the light-shielding film and the pixel electrode 54 in the openings 52a and 52b. Upon employing this structure, the pixel electrode 54 does not have to ride over the end of the light-shielding film 250, and the problem such as short-circuiting is prevented from occurring at the end.

In FIG. 14B, the steps up to that of FIG. 5A (but prior to forming the oxide 251) are executed according to the steps of the embodiment 1. That is, the steps are conducted up to forming the light-shielding film 250 of the aluminum film on the second interlayer-insulating film 249.

Next, the third interlayer-insulating film 55 of an acrylic film is formed, and openings 56a and 56b are formed therein. Here, the contact hole 57 is also formed simultaneously.

Then, in this state, an oxide 58 is formed on the exposed surface of the light-shielding film 250. In this embodiment, the oxide 58 is formed by the anodic oxidation method. However, there may be employed the thermal oxidation method or the plasma oxidation method.

Thus, after the oxide 58 is formed on part of the surface (upper surface) of the light-shielding film 250, then, the pixel electrode 59 of an ITO film is formed. Thus, the storage capacitors are formed by the light-shielding film 250, oxide 58 of the light-shielding film and pixel electrode 59 in the openings 56a and 56b. In this constitution, too, the pixel electrode is prevented from being short-circuited at the end of the light-shielding film like in FIG. 14A.

The constitution of this embodiment can be freely combined with any one of the constitutions of the embodiments 1 to 12.

Embodiment 14

Figure 15A:
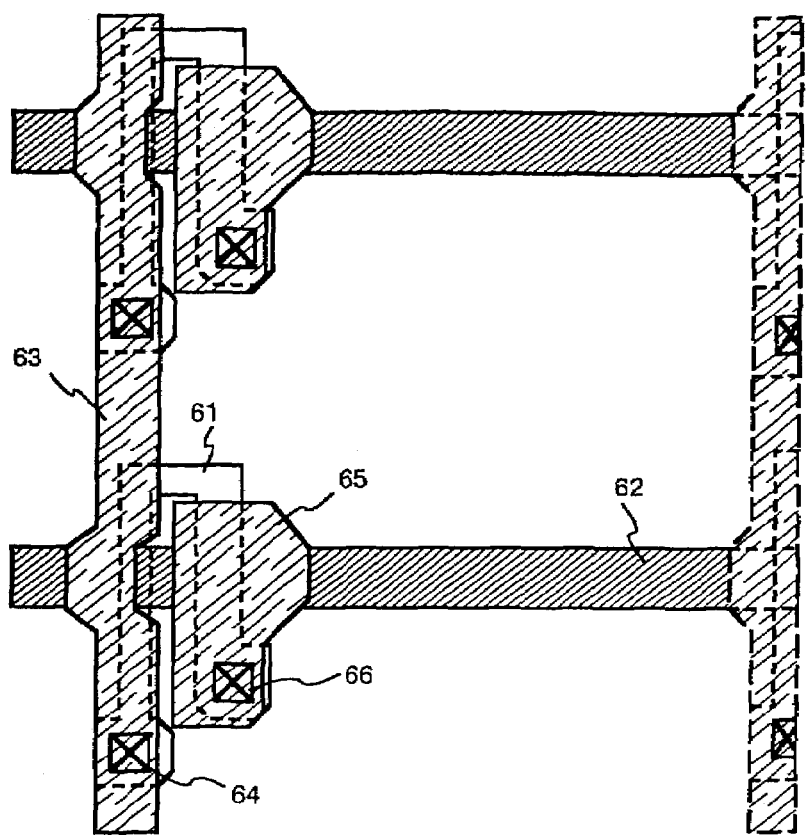
FIGS. 15A and 15B are views illustrating the structure of the upper surface of the pixel unit.
Figure 15B:
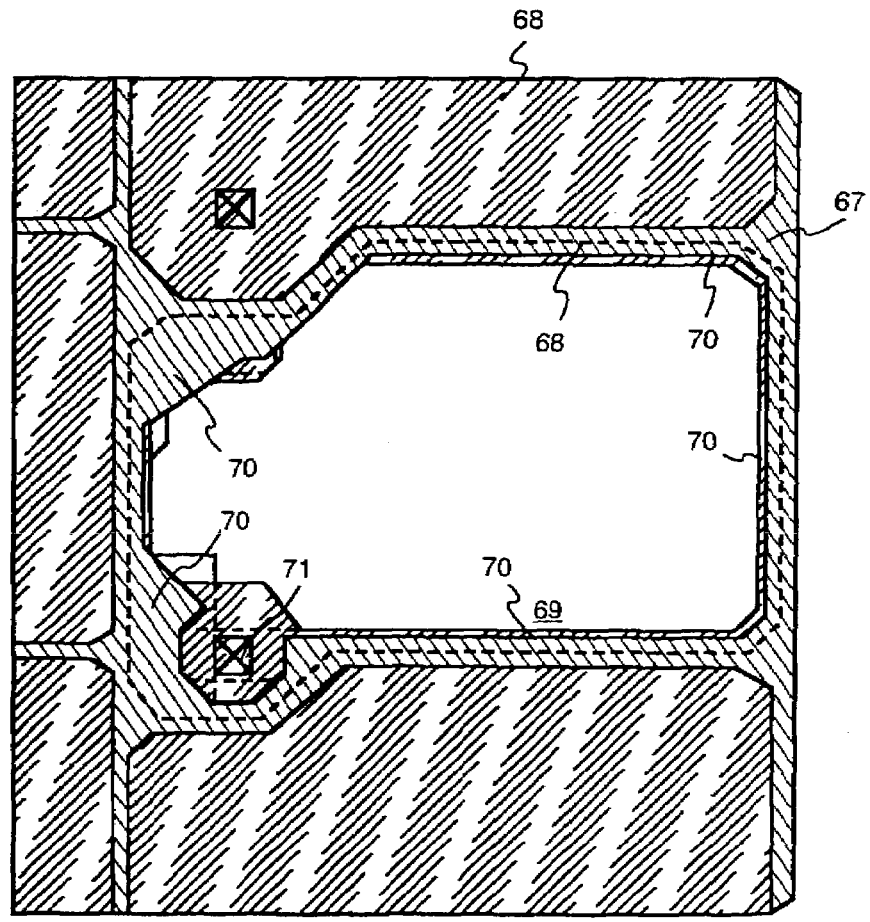

This embodiment deals with the structure of the pixel unit formed by the invention with reference to FIGS. 15A to 15B. The basic sectional structures were described already with reference to FIGS. 1 to 5B. Here, therefore, the description proceeds paying attention to a positional relationship (position for forming the storage capacity) between the light-shielding film and the pixel electrode.

First, the step of FIG. 15A is the one where the steps have been finished up to the step shown in FIG. 4D, wherein reference numeral 61 denotes an active layer, 62 denotes a gate wiring, 63 denotes a source wiring, 64 denotes a contact portion between the active layer and the source wiring, 65 denotes a drain wiring (drain electrode), and 66 denotes a contact portion between the active layer and the drain wiring.

Next, the step of FIG. 15B is the one where the steps have been finished up to the step shown in FIG. 5B. This state is the one where the light-shielding film 67 and the pixel electrode 68 are overlapped one upon the other. The pixel electrode 68 is partly represented by a dotted line in order to clarify the positional relationship of the underlying layer relative to the light-shielding film.

Referring to FIG. 15B, the pixel electrode 68 is so formed as to be overlapped on the light-shielding film 67 along the outer peripheral portion of the picture display region 69. The region 70 where the pixel electrode 68 and the light-shielding film 67 are overlapped one upon the other, works as a storage capacity.

Reference numeral 71 denotes a contact portion between the drain wiring 65 and the pixel electrode 68. The contact portion 71 cannot be provided with the light-shielding film 67. However, light is completely shielded by the drain wiring layer 65, and the TFT is never exposed to light.

The structure of this embodiment has an advantage in that there is no need of separately forming a wiring for forming the capacitor, and the numerical aperture of the pixels can be enhanced. The storage capacity 70 is formed on the source wiring 63 or on the gate wiring 62, and does not substantially decrease the numerical aperture. Accordingly, the picture display region 69 is maximized, and a bright picture is obtained.

The constitution of this embodiment can be freely combined with any one of the constitutions of the embodiments 1 to 13.

Embodiment 15

This embodiment deals with a case where the crystalline silicon film is formed by means different from that of the embodiment 1.

In the embodiment 1, a catalytic element (nickel) was used for crystallizing the amorphous semiconductor film (concretely, amorphous silicon film). This embodiment, however, deals with the case where the amorphous semiconductor film is thermally crystallized without using the catalytic element.

In the case of this embodiment, the amorphous silicon film that is formed is crystallized through the heat treatment at a temperature of from 580 to 640° C. (typically, 600° C.) for 12 to 30 hours (typically, from 16 to 24 hours) to obtain a crystalline silicon film. Therefore, the gettering step shown in the embodiment 1 can be omitted.

With the structure of the invention being realized as described above, the invention can be easily combined with a process which uses the crystalline silicon film which is the so-called high-temperature polysilicon.

The constitution of this embodiment can be freely combined with any one of the embodiments 1 to 7 and 9 to 14.

Embodiment 16

This embodiment deals with an example of forming the first interlayer-insulating film by a method different from that of the embodiment 1. The description refers to FIGS. 16A and 16B.

First, the steps are effected up to the activation step shown in FIG. 4C according to the manufacturing steps of the embodiment 1. In this embodiment, a silicon oxynitride film (described here as silicon oxynitride film (A) 1601) is used as the silicon oxynitride film 240. After the activation step has been finished, a silicon oxynitride film (B) 1602 is formed thereon maintaining a thickness of from 600 nm to 1 μm (800 nm in this embodiment). Then, a resist mask 1603 is formed thereon (FIG. 16A).

The silicon oxynitride film (A) 1601 and the silicon oxynitride film (B) 1602 have different composition ratios of nitrogen, oxygen, hydrogen and silicon. The silicon oxynitride film (A) 1601 contains 7% of nitrogen, 59% of oxygen, 2% of hydrogen and 32% of silicon, and the silicon oxynitride film (B) 1602 contains 33% of nitrogen, 15% of oxygen, 23% of hydrogen and 29% of silicon. The composition ratios are not limited thereto only, as a matter of course.

Further, the resist mask 1603 has a large thickness and is capable of completely flattening the undulations on the surface of the silicon oxynitride film (B) 1602.

Next, the resist mask 1603 and the silicon oxynitride film (B) 1602 are etched by the dry etching method using a mixture gas of carbon tetrafluoride and oxygen. In the case of this embodiment, the silicon oxynitride film (B) 1602 and the resist mask 1603 are etched at nearly an equal rate by the dry etching using the mixture gas of carbon tetrafluoride and oxygen.

Through the step of etching, the resist mask 1603 is completely removed as shown in FIG. 16B, and the silicon oxynitride film (B) is partly etched (from the surface to a depth of 300 nm in this embodiment). As a result, the flatness of the surface of the resist mask 1603 is directly reflected onto the flatness on the surface of the silicon oxynitride film (B) that is etched.

Thus, there is obtained a first interlayer-insulating film 1604 having a very high degree of flatness. In the case of this embodiment, the first interlayer-insulating film 1604 has a thickness of 500 nm. As for the subsequent steps, reference should be made to the manufacturing steps of the embodiment 1.

The constitution of this embodiment can be freely combined with any one of the embodiments 1 to 15.

Embodiment 17

A variety of known liquid crystal materials can be used for the AM-LCD manufactured according to the invention. Examples of the materials include TN liquid crystal, PDLC (polymer-dispersed liquid crystal), FLC (ferroelectric liquid crystal), AFLC (antiferroelectric liquid crystal) and a mixture of FLC and AFLC.

For example, there can be used materials disclosed in "H. Furue et al.; Characteristics and Driving Scheme of Polymer-Stabilized Monostable FLCD Exhibiting Fast Response Time and High Contrast Ratio with Gray-Scale Capability, SID, 1998", "T. Yoshida et al.; A full-Color Thresholdless Antiferroelectric LCD Exhibiting Wide Viewing Angle with Fast Response time, 841, SID 97 DIGEST, 1997" and U.S. Pat. No. 5,594,569.

By using the thresholdless antiferroelectric liquid crystal, in particular, the power-source voltage needs be about 5 to 8 volts since the liquid crystal operates on a voltage of about ±2.5 V. That is, it is allowed to operate the drive circuit unit and the pixel unit on the same power-source voltage and, hence, to decrease the amount of electric power consumed by the whole AM-LCD.

Further, the ferroelectric liquid crystal and the antiferroelectric liquid crystal have advantage in that they exhibit a response speed faster than that of the TN liquid crystal. This advantage could not be obtained with the conventional TFTs. When there is used the TFTs having the crystalline structure as explained in the embodiment 1, however, there are realized the TFTs that operate at a very high speed, making it possible to realize the AM-LCD that exhibits a high picture response speed by utilizing the high response speed of the ferroelectric liquid crystal or of the antiferroelectric liquid crystal to a sufficient degree.

It needs not be pointed out that the AM-LCD of this embodiment can be used as a display unit for an electric appliance such as a personal computer or the like.

The constitution of this embodiment can be freely combined with any one of the constitutions of the embodiments 1 to 16.

Embodiment 18

This invention permits the formation of an interlayer-insulating film on the conventional MISFET and the formation of a TFT further thereon. In other words, the invention makes it possible to realize a semiconductor device of the three-dimensional structure in which the reflection-type AM-LCD is formed on the semiconductor circuit.

Further, the semiconductor circuit may be formed on an SOI substrate such as SIMOX, Smart-Cut (registered trademark of SOITEC Co.) or ELTRAN (registered trademark of Canon Co.).

This embodiment can be put into practice by being combined with any one of the constitutions of the embodiments 1 to 17.

Embodiment 19

This invention can also be adapted to the active matrix-type EL (electroluminescence) display (often referred to as EL display device). An example is shown in FIG. 17.

Figure 17:
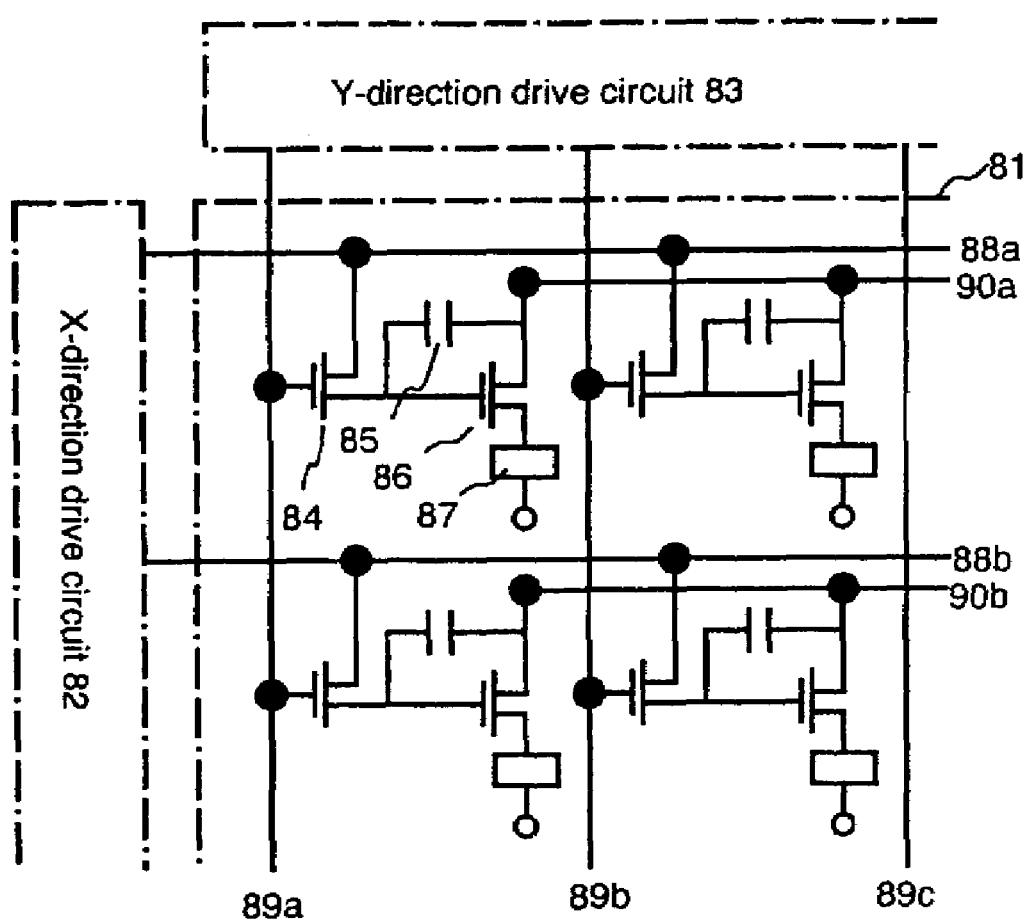
FIG. 17 is a view illustrating the circuit constitution of an active matrix-type EL display.

FIG. 17 is a circuit diagram of the active matrix-type EL display, wherein reference numeral 81 denotes a display region which is surrounded by an X-direction (source side) drive circuit 82 and a Y-direction (gate side) drive circuit 83. Each pixel in the display region 81 includes a switching TFT 84, a capacitor 85, a current-control TFT 86 and an EL element 87. To the switching TFT 84 are connected an X-direction signal line (source signal line) 88*a* or 88*b*, and a Y-direction signal line (gate signal line) 89*a*, 89*b* or 89*c*. To the current-control TFT 86 are connected power-source lines 90*a* and 90*b*.

In the active matrix-type EL display of this embodiment, the gate-insulating film of the TFTs used in the X-direction drive circuit 82 and the Y-direction drive circuit 83 has a thickness smaller than the gate-insulating film of the switching TFTs 84 or the current-control TFTs 86. Further, the capacitor 85 is formed by the storage capacitor of the present invention.

The active matrix-type EL display of this invention can be combined with any one of the constitutions of the embodiments 1 to 16 and 18.

Embodiment 20

This embodiment deals with an EL (electroluminescence) display device manufactured according to the present invention. Here, FIG. 18A is a top view of the EL display device of this invention, and FIG. 18B is a sectional view thereof.

Figure 18A:
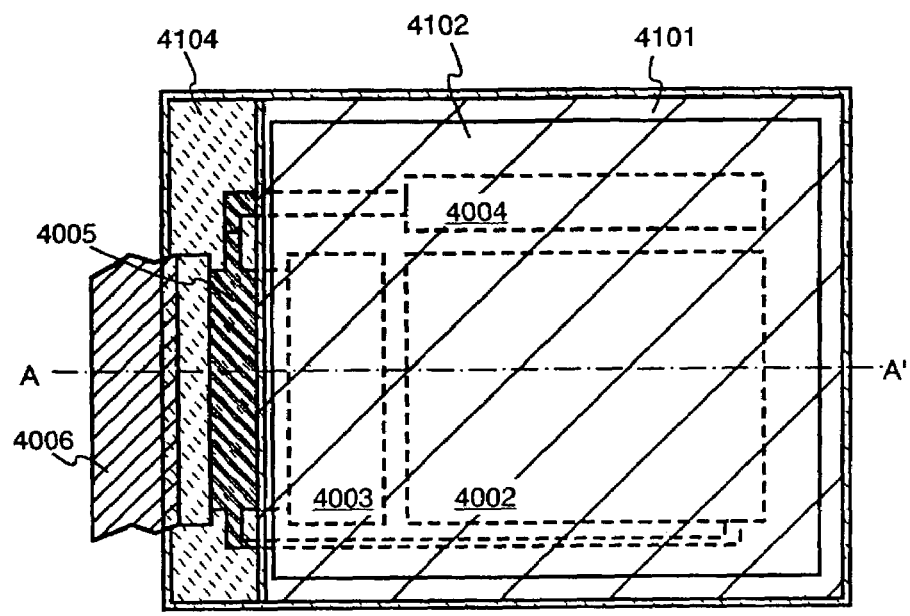
FIGS. 18A and 18B are views illustrating the structure of the upper surface of the EL display device and the structure of the EL display device in cross section.

In FIG. 18A, reference numeral 4001 denotes a substrate, 4002 denotes a pixel unit, 4003 denotes a source-side drive circuit, and 4004 denotes a gate-side drive circuit. These drive circuits are connected to an FPC (flexible printed circuit) 4006 through wirings 4005, and are connected to an external unit.

Here, a first sealing member 4101, a cover member 4102, a filler member 4103 and a second sealing member 4104 are so provided as to surround the pixel unit 4002, source-side drive circuit 4003 and gate-side drive circuit 4004.

Figure 18B:
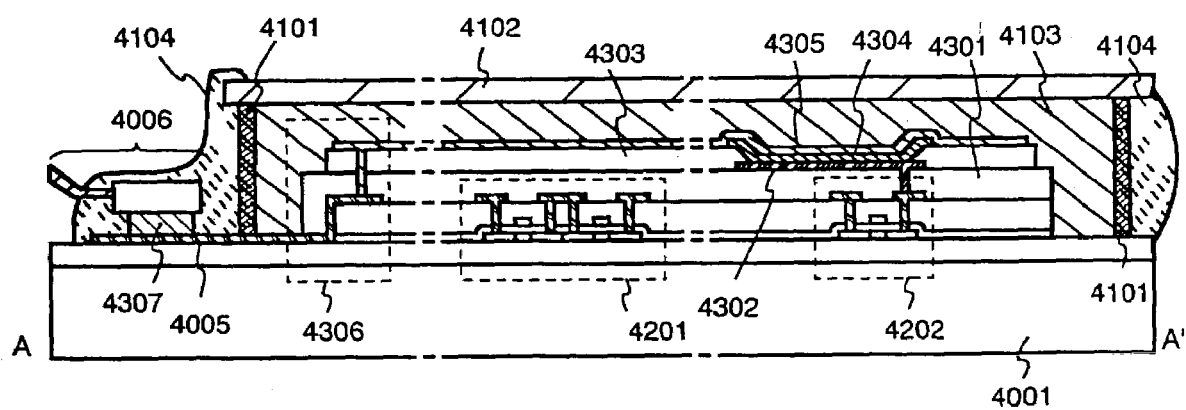

FIG. 18B is a sectional view along the line A-A' of FIG. 18A, and wherein the substrate 4001 has, formed thereon, drive TFTs (n-channel TFTs and p-channel TFTs are shown here) 4201 included in the source-side drive circuit 4003 and current-control TFTs (TFTs for controlling current to the EL elements) 4202 included in the pixel unit 4202.

In this embodiment, the drive TFT 4201 has the same structure as that of the drive circuit unit of FIG. 1, and the current-control TFT 4202 has the same structure as that of the pixel unit of FIG. 1. The pixel unit 4002 is provided with a storage capacitor (corresponding to the capacitor 85 of FIG. 17) connected to the gate of the current-control TFT 4202. This storage capacitor (not shown) has the same structure as that of the storage capacitor 254 shown in FIG. 5B.

An interlayer-insulating film (flat film) 4301 of a resin material is formed on the drive TFT 4201 and on the pixel TFT 4202, and a pixel electrode (anode) 4302 is formed thereon so as to be electrically connected to the drain of the pixel TFT 4202. A transparent electrically conducting film having a large work function is used as the pixel electrode 4302. The transparent electrically conducting film can be formed of a compound of indium oxide and tin oxide or a compound of indium oxide and zinc oxide.

An insulating film 4303 is formed on the pixel electrode 4302. An opening is formed in the insulating film 4303 on the pixel electrode 4302. An EL (electroluminescence) layer 4304 is formed in the opening on the pixel electrode 4302. A known organic EL material or inorganic EL material can be used as the EL layer 4304. The organic EL material may be either of the low-molecular type (monomer type) or of the high-molecular type (polymer type).

The EL layer 4304 may be formed relying on a known technique. The EL layer may have a laminated-layer structure in which a positive hole-injection layer, a positive hole transport layer, a light-emitting layer and an electron transport layer or an electron injection layer are freely combined together, or may have a single-layer structure.

A cathode 4305 of a light-shielding electrically conducting film (typically, an electrically conducting film chiefly comprising aluminum, copper or silver, or a laminated-layer film thereof with other electrically conducting film) is formed on the EL layer 4304. It is desired that moisture or oxygen is removed as much as possible from the interface between the cathode 4305 and the EL layer 4304. Therefore, the two layers are continuously formed in vacuum, or the EL layer 4304 is formed in a nitrogen atmosphere or in a rare gas atmosphere, and the cathode 4305 is formed being kept away from oxygen or moisture. In this embodiment, the above film is formed by using a film-forming apparatus of a multi-chamber type (cluster tool type).

The cathode 4305 is electrically connected to the wiring 4005 on a region denoted by 4306. The wiring 4005 is for applying a predetermined voltage to the cathode 4305, and is electrically connected to the FPC 4006 through an electrically conducting material 4307.

Thus, an EL element is formed comprising the pixel electrode (anode) 4302, EL layer 4304 and cathode 4305. The EL element is surrounded by the first sealing member 4101 and by the covering member 4102 stuck to the substrate 4001 with the first sealing member 4101, and is filled with a filler 4103.

As the covering member 4102, there can be used a glass plate, a metal plate (typically, a stainless steel plate), a ceramics plate, an FRP (fiber glass-reinforced plastics) plate, a PVF (polyvinyl fluoride) film, a mylar film, a polyester film or an acrylic film. There can be further used a sheet of a structure in which an aluminum foil is sandwiched by the PVF films or the mylar films.

When light is radiated from the EL element toward the covering member, however, the covering member must be transparent. In such a case, there is used a transparent material such as glass plate, plastic plate, polyester film or acrylic film.

As the filler 4103, there can be used an ultraviolet-ray curing resin or a thermosetting resin, such as PVC (polyvinyl chloride), acrylic, polyimide, epoxy resin, silicone resin, PVB (polyvinyl butyral) or EVA (ethylenevinyl acetate). A hygroscopic material (preferably, barium oxide) is provided in the filler 4103 to suppress the deterioration of the EL element.

A spacer may be contained in the filler 4103. Here, hygroscopic property can be imparted to the spacer itself when it is formed of barium oxide. When the spacer is provided, further, a resin film formed on the anode 4305 effectively works as a buffer layer for relaxing pressure from the spacer.

The wiring 4005 is electrically connected to the FPC 4006 through the electrically conducting material 4305. The wiring 4005 transmits to the FPC 4006 a signal that is sent to the pixel unit 4002, source-side drive circuit 4003 and gate-side drive circuit 4004, and is electrically connected to an external unit through the FPC 4006.

In this embodiment, further, the second sealing member 4104 is so provided as to cover an exposed portion of the first sealing member 4101 and a portion of the FPC 4006, in order to thoroughly shut off the EL element from the open atmosphere. Thus, the EL display device is obtained having a sectional structure as shown in FIG. 18B. The EL display device of this embodiment may be manufactured in combination with any one of the constitutions of the embodiments 1 to 16 and 18.

Embodiment 21

Figure 19A:
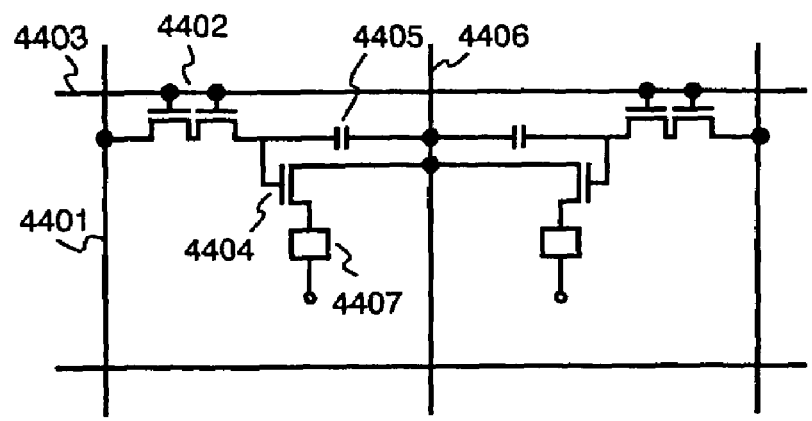
FIGS. 19A to 19C are views illustrating the constitution of a pixel unit in the EL display device.
Figure 19B:
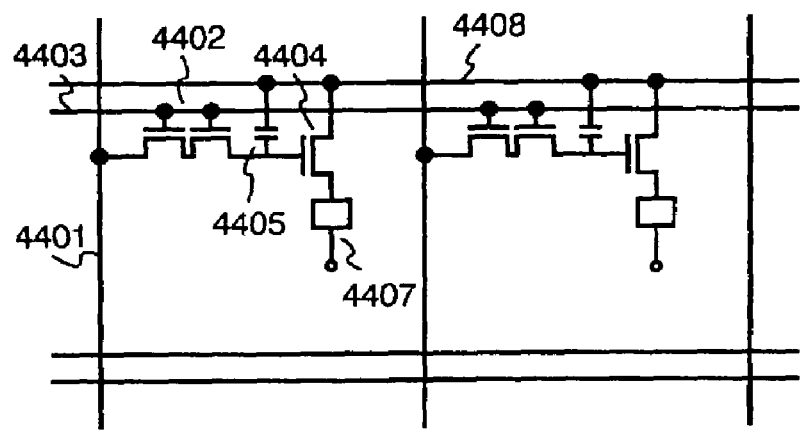
Figure 19C:
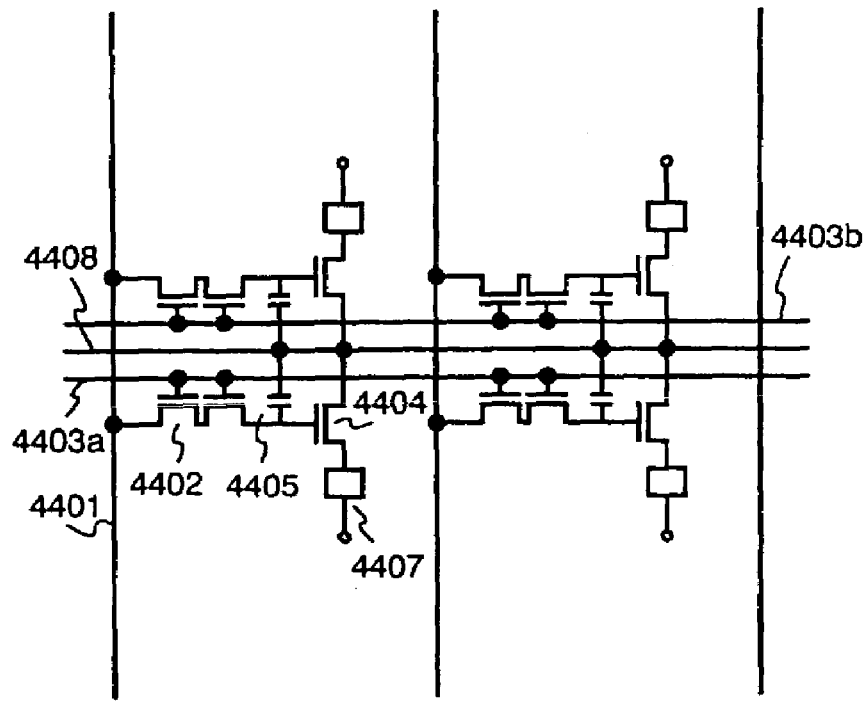

FIGS. 19A to 19C illustrate the structure of a pixel that can be used in the pixel unit of the EL display device of the embodiment 20. In this embodiment, reference numeral 4401 denotes a source wiring of a switching TFT 4402, reference numeral 4403 denotes a gate wiring of the switching TFT 4402, reference numeral 4404 denotes a current-control TFT 4405 denotes a capacitor, 4406 and 4408 denote current feeder lines, and reference numeral 4407 denotes an EL element.

FIG. 19A illustrates an example in which the current feeder line 4406 is used in common for the two pixels. That is, the feature resides in that the two pixels are formed symmetrically with the current feeder line 4406 as a center. In this case, the number of the power feeder lines can be decreased, enabling the pixel unit to be more finely fabricated.

FIG. 19B illustrates a case where the current feeder line 4408 is formed in parallel with the gate wiring 4403. In FIG. 19B, the current feeder line 4408 is not overlapped on the gate wiring 4403. However, they may be formed so as to be overlapped on upon the other via an insulating film provided they are formed in different layers. In this case, the power feeder line 4408 and the gate wiring 4403 are allowed to share their areas, making it possible to more finely fabricate the pixel unit.

Further, FIG. 19C has a feature in that the current feeder line 4408 is formed in parallel with the gate wiring 4403a and 4403b like in the structure of FIG. 19B, and the two pixels are symmetrically formed with the current feeder line 4408 as a center. It is further effective if the current feeder line 4408 is so formed as to be overlapped on either one of the gate wirings 4403a and 4403b. In this case, the number of the power feeder lines can be decreased, making it possible to further finely fabricate the pixel unit.

Embodiment 22

The electro-optical device and semiconductor circuit of this invention can be used as a display unit or a signal processing circuit of electric appliances. Examples of the electric appliances include a video camera, a digital camera, a projector, a projection TV, a goggle-type display (head-mount display), a navigation system, an acoustic reproduction apparatus, a notebook personal computer, a game device, a portable data terminal (mobile computer, portable telephone, portable game machine, digital book, etc.), and picture reproducing apparatus equipped with a recording medium. Concrete examples of the electric appliances are shown in FIGS. 20A to 22B.

Figure 20A:
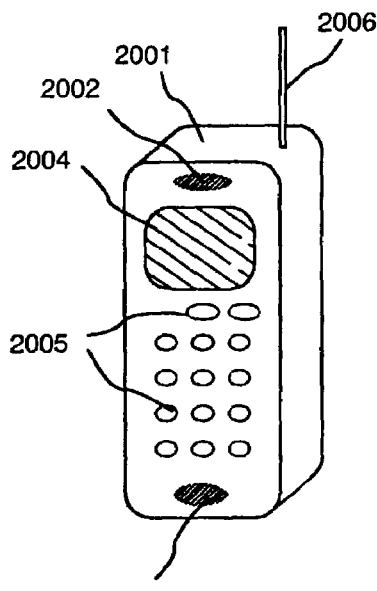
FIGS. 20A to 20F are views illustrating electric appliances.

FIG. 20A shows a portable telephone constituted by a main body 2001, a voice output unit 2002, a voice input unit 2003, a display unit 2004, operation switches 2005 and an antenna 2006. The electro-optical device of the invention can be used as the display unit 2004, and the semiconductor circuit of the invention can be used as the voice output unit 2002, voice input unit 2003, or as CPU or memory.

Figure 20B:
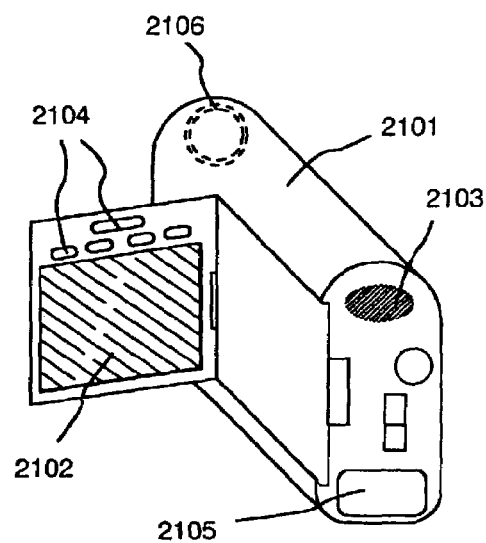

FIG. 20B illustrates a video camera constituted by a main body 2101, a display unit 2102, a voice input unit 2103, operation switches 2104, a battery 2105 and an image-receiving unit 2106. The electro-optical device of the invention can be used as the display unit 2102, and the semiconductor circuit of the invention can be used as the voice input unit 2103, CPU or memory.

Figure 20C:
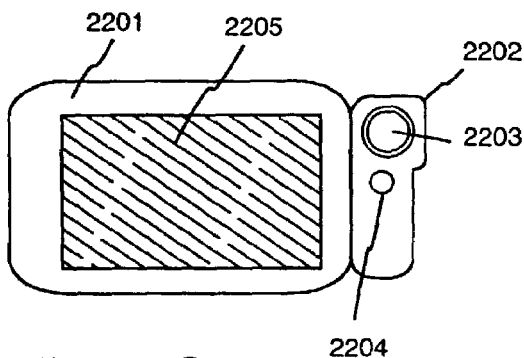

FIG. 20C illustrates a mobile computer which is constituted by a main body 2201, a camera unit 2202, an image-receiving unit 2203, operation switches 2204 and a display unit 2205. The electro-optical device of the invention can be used as the display unit 2205, and the semiconductor circuit of the invention can be used as CPU or memory.

Figure 20D:
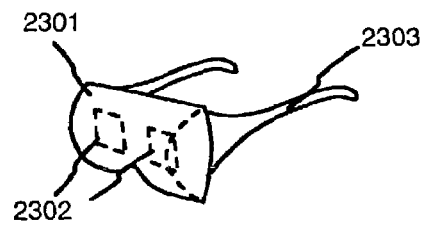

FIG. 20D shows a goggle-type display constituted by a main body 2301, a display unit 2302 and an arm unit 2303. The electro-optical device of the invention can be used as the display unit 2302, and the semiconductor circuit of the invention can be used as CPU or memory.

Figure 20E:
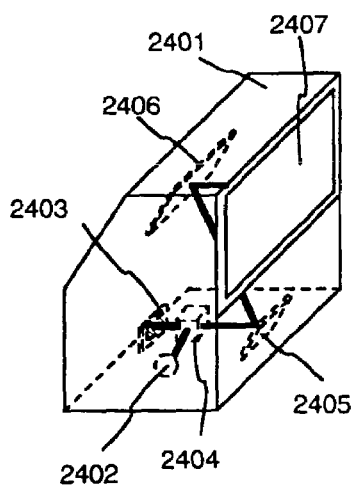

FIG. 20E shows a rear projector (projection TV) constituted by a main body 2401, a light source 2402, a liquid crystal display device 2403, a polarized beam splitter 2404, reflectors 2405, 2406, and a screen 2407. The invention can be used as the liquid crystal display device 2403, and the semiconductor circuit of the invention can be used as CPU or memory.

Figure 20F:
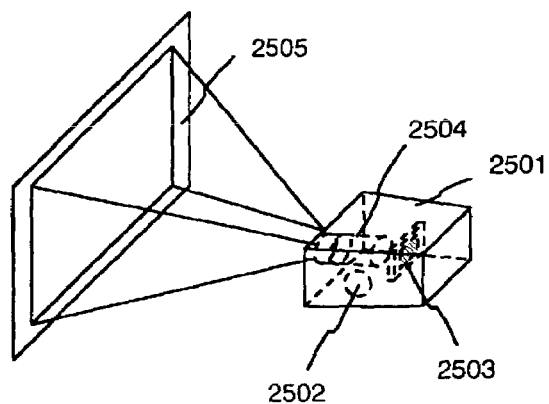

FIG. 20F shows a front projector constituted by a main body 2501, a light source 2502, a liquid crystal display device 2503, an optical system 2504 and a screen 2505. The invention can be used as the liquid crystal display device 2503, and the semiconductor circuit of the invention can be used as CPU or memory.

Figure 21A:
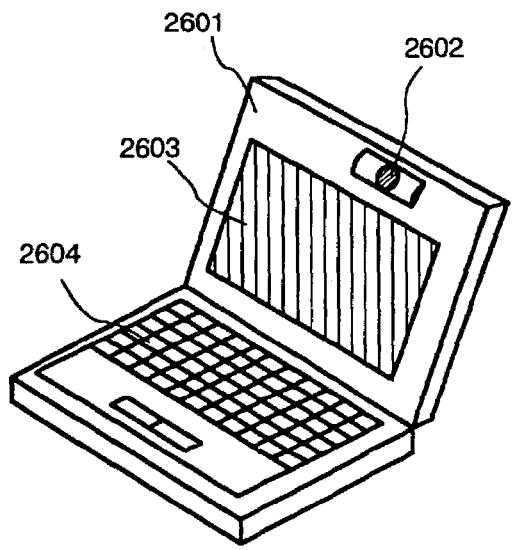
FIGS. 21A to 21D are views illustrating electric appliances.

FIG. 21A shows a personal computer which includes a main body 2601, an image input unit 2602, a display unit 2603 and a keyboard 2604. The electro-optical device of the invention can be used as the display unit 2603, and the semiconductor circuit of the invention can be used as CPU or memory.

Figure 21B:
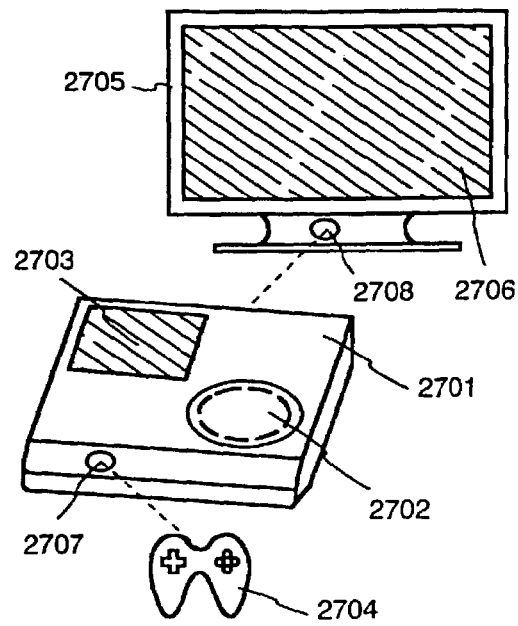

FIG. 21B shows an electronic play machine (game machine) including a main boy 2701, a recording medium 2702, a display unit 2703, and a controller 2704. The voice and image output from the electronic play machine are reproduced by the display that includes a housing 2705 and a display unit 2706. Wired communication, wireless communication or optical communication can be used as communication means between the controller 2704 and the main body 2701 or as communication means between the electronic play machine and the display. In this embodiment, infrared rays are detected by sensors 2707 and 2708. The electro-optical device can be used as the display units 2703 and 2706, and the semiconductor circuit of the invention can be used as CPU or memory.

Figure 21C:
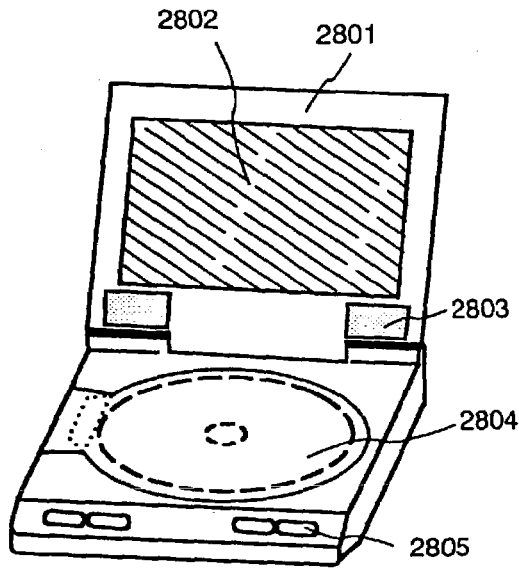

FIG. 21C-shows a player (picture reproducing apparatus) using a recording medium storing a program (hereinafter referred to as recording medium), which includes a main body 2801, a display unit 2802, a speaker unit 2803, a recording medium 2804 and operation switches 2805. This picture reproducing apparatus uses a DVD (digital versatile disk) or a CD as a recording medium, and enables the user to enjoy listening to music, viewing a movie, playing a game, or playing an internet system. The electro-optical device of the invention can be used as the display unit 2802, CPU or memory.

Figure 21D:
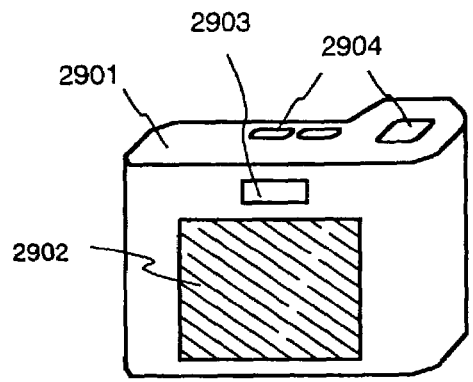

FIG. 21D shows a digital camera that includes a main body 290a, a display unit 2902, an eyepiece unit 2903, operation switches 2904, and an image-receiving unit (not shown). The electro-optical device of the present invention can be used as the display unit 2902, CPU and memory.

Figure 22A:
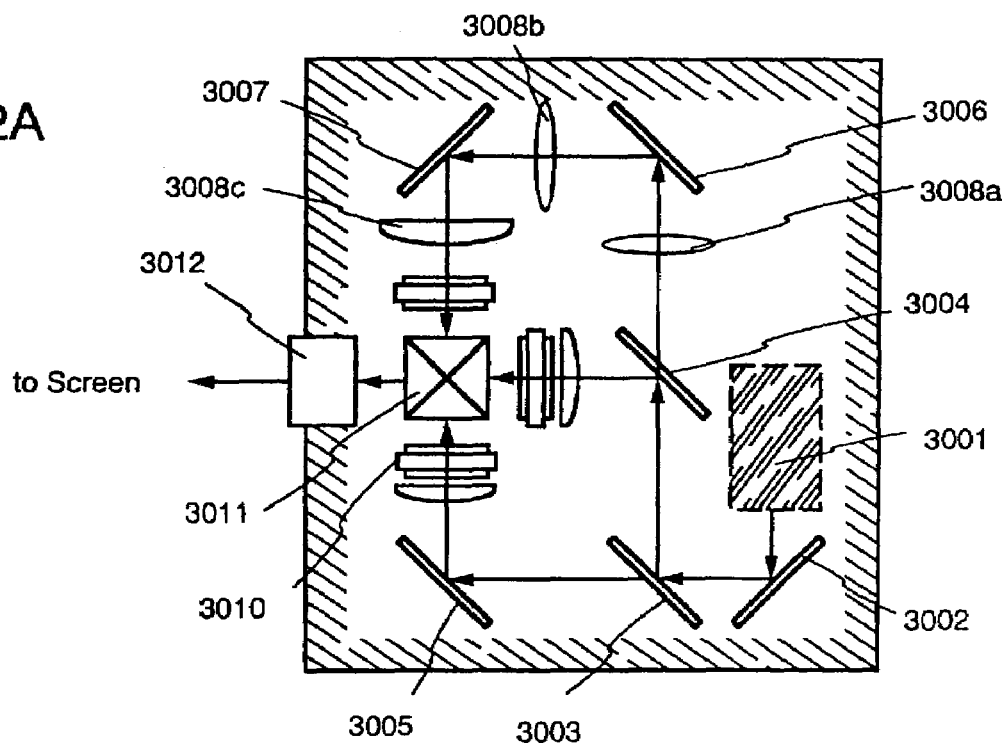
FIGS. 22A and 22B are views illustrating the structure of an optical engine.
Figure 22B:
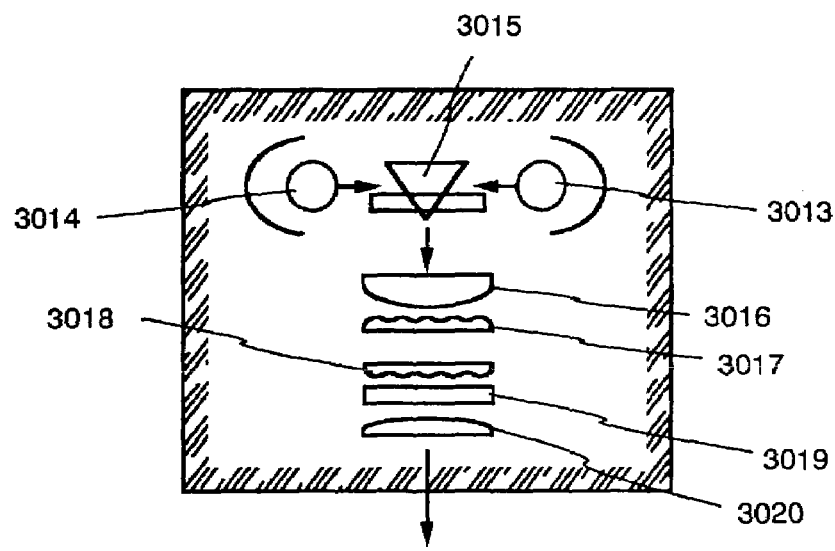

FIGS. 22A to 22B illustrates in detail an optical engine that can be used as the rear projector of FIG. 20E or as the front projector of FIG. 2F, and wherein FIG. 22A illustrates the optical engine, and FIG. 22B illustrates a light source optical system contained in the optical engine.

The optical engine shown in FIG. 22A includes a light source optical system 3001, mirrors 3002, 3005 to 3007, dichroic mirrors 3003 and 3004, optical lenses 3008a to 3088c, a prism 3011, a liquid crystal display device 3010, and a projection optical system 3012. The projection optical system 3012 is the one equipped with a projection lens. This embodiment deals with an example of a three-plate type using three liquid crystal display devices 3010, which, however, may be of a single-plate type. An optical lens, a film having a polarizing function, a film for adjusting the phase difference or an IR film may be provided in the optical paths indicated by arrows in FIG. 22A.

As shown in FIG. 22B, further, the light source optical system 3001 includes light sources 3013 and 3014, a synthesizer prism 3015, collimator lenses 3016 and 3020, lens arrays 3017 and 3018, and a polarization conversion element 3019. The light source optical system shown in FIG. 22B uses two light sources. However, only one light source may be used or three or more light sources may be used. Further, an optical lens, a film having a polarizing function, a film for adjusting the phase difference or an IR film may be provided somewhere in the optical path of the light source optical system.

As described above, this invention can be applied over a very wide range and can be adapted to electric appliances of any field. Further, the electric appliances of the embodiment can be realized by using the constitution of any combination of the embodiments 1 to 21.

This invention makes it possible to form TFTs having gate-insulating films of different thicknesses on the same substrate. It is therefore allowed to arrange the circuits having suitable performances that meet specifications required for the circuits in the electronic devices as represented by the AM-LCD or in the semiconductor devices inclusive of electric appliances having such electronic devices as display units, making it possible to greatly enhance the performance and reliability of the semiconductor devices.

In the pixel unit of electronic devices as represented by the AM-LCD, furthermore, a storage capacitor having a large capacity can be formed occupying a small area. This makes it possible to maintain a sufficiently large storage capacity even in the electronic devices having a display unit of a diagonal of not larger than one inch without decreasing the numerical aperture.

What is claimed is:

1. A semiconductor device comprising:
   a thin film transistor over a substrate, the thin film transistor comprising a semiconductor layer and a gate electrode with a gate insulating film interposed therebetween;
   a source electrode and a drain electrode electrically connected to the semiconductor layer;
   a pixel electrode electrically connected to one of the source electrode and the drain electrode;
   an interlayer-insulating film covering the thin film transistor, the source electrode and the drain electrode;
   a light-shielding film formed on the interlayer-insulating film; and
   a common feeder line electrically connected to the light-shielding film through an electrically conducting film,
   wherein any portion of the light-shielding film is not overlapped with the common feeder line.

2. A semiconductor device according to claim 1, further comprising an insulating film between the light-shielding film and the electrically conducting film.

3. A semiconductor device according to claim 1, wherein the pixel electrode formed over the light-shielding film.

4. A semiconductor device according to claim 1, wherein the light-shielding film comprises aluminum.

5. A semiconductor device according to claim 1, wherein the interlayer-insulating film comprises at least one selected from the group consisting of a polyimide film, an acrylic film, a polyamide film, a BCB (benzocyclobutene) film, and a MSSQ (methyl silsesquioxane) film.

6. A semiconductor device according to claim 1, wherein the semiconductor device is an EL display device.

7. A semiconductor device according to claim 1, wherein the semiconductor device is at least one selected from the group consisting of a portable telephone, a video camera, a personal computer, a goggle-type display, a projector, an electronic play machine, a picture reproducing apparatus, and a digital camera.

8. A semiconductor device according to claim 1, further comprising a capacitor in a portion where the light-shielding film and the electrically conducting film are overlapped.

9. A semiconductor device according to claim 1, wherein the electrically conducting film is transparent.

10. A semiconductor device according to claim 1, wherein the electrically conducting film is connected to the light-shielding film through an insulating film.

11. A semiconductor device comprising:
    a thin film transistor over a substrate, the thin film transistor comprising a semiconductor layer and a gate electrode with a gate insulating film interposed therebetween;
    a source electrode and a drain electrode electrically connected to the semiconductor layer;
    a pixel electrode electrically connected to one of the source electrode and the drain electrode;
    an interlayer-insulating film covering the thin film transistor, the source electrode and the drain electrode;
    a light-shielding film formed on the interlayer-insulating film; and
    a common feeder line electrically connected to the light-shielding film through an electrically conducting film,
    wherein the common feeder line is not connected to the pixel electrode, and
    wherein any portion of the light-shielding film is not overlapped with the common feeder line.

12. A semiconductor device according to claim 11, further comprising an insulating film between the light-shielding film and the electrically conducting film.

13. A semiconductor device according to claim 11, wherein the pixel electrode formed over the light-shielding film.

14. A semiconductor device according to claim 11, wherein the light-shielding film comprises aluminum.

15. A semiconductor device according to claim 11, wherein the interlayer-insulating film comprises at least one selected from the group consisting of a polyimide film, an acrylic film, a polyamide film, a BCB (benzocyclobutene) film, and a MSSQ (methyl silsesquioxane) film.

16. A semiconductor device according to claim 11, wherein the semiconductor device is an EL display device.

17. A semiconductor device according to claim 11, wherein the semiconductor device is at least one selected from the group consisting of a portable telephone, a video camera, a personal computer, a goggle-type display, a projector, an electronic play machine, a picture reproducing apparatus, and a digital camera.

18. A semiconductor device according to claim 11, further comprising a capacitor in a portion where the light-shielding film and the electrically conducting film are overlapped.

19. A semiconductor device according to claim 11, wherein the electrically conducting film is transparent.

20. A semiconductor device according to claim 11, wherein the electrically conducting film is connected to the light-shielding film trough an insulating film.

21. A semiconductor device comprising:
    a thin film transistor over a substrate, the thin film transistor comprising a semiconductor layer and a gate electrode with a gate insulating film interposed therebetween;
    a source electrode and a drain electrode electrically connected to the semiconductor layer;
    a pixel electrode electrically connected to one of the source electrode and the drain electrode;
    an interlayer-insulating film covering the thin film transistor;
    a light-shielding film formed over the interlayer-insulating film; and
    a common feeder line electrically connected to the light-shielding film through an electrically conducting film,
    wherein any portion of the light-shielding film is not overlapped with the common feeder line.

22. A semiconductor device according to claim 21, further comprising an insulating film between the light-shielding film and the electrically conducting film.

23. A semiconductor device according to claim 21, wherein the pixel electrode formed over the light-shielding film.

24. A semiconductor device according to claim 21, wherein the light-shielding film comprises aluminum.

25. A semiconductor device according to claim 21, wherein the interlayer-insulating film comprises at least one selected from the group consisting of a polyimide film, an acrylic film, a polyamide film, a BCB (benzocyclobutene) film, and a MSSQ (methyl silsesquioxane) film.

26. A semiconductor device according to claim 21, wherein the semiconductor device is an EL display device.

27. A semiconductor device according to claim 21, wherein the semiconductor device is at least one selected from the group consisting of a portable telephone, a video camera, a personal computer, a goggle-type display, a projector, an electronic play machine, a picture reproducing apparatus, and a digital camera.

28. A semiconductor device according to claim 21, further comprising a capacitor in a portion where the light-shielding film and the electrically conducting film are overlapped.

29. A semiconductor device according to claim 21, wherein the electrically conducting film is transparent.

30. A semiconductor device according to claim 21, wherein the electrically conducting film is connected to the light-shielding film through an insulating film.

31. A semiconductor device comprising:
   a thin film transistor over a substrate, the thin film transistor comprising a semiconductor layer and a gate electrode with a gate insulating film interposed therebetween;
   a source electrode and a drain electrode electrically connected to the semiconductor layer;
   a pixel electrode electrically connected to one of the source electrode and the drain electrode;
   an interlayer-insulating film covering the thin film transistor, the source electrode and the drain electrode;
   a light-shielding film formed on the interlayer-insulating film; and
   a common feeder line electrically connected to the light-shielding film through an electrically conducting film,
   wherein the electrically conducting film is wider than the common feeder line in a lateral direction, and
   wherein the light-shielding film and the common feeder line are not overlapped with each other.

32. A semiconductor device according to claim 31, further comprising an insulating film between the light-shielding film and the electrically conducting film.

33. A semiconductor device according to claim 31, wherein the pixel electrode formed over the light-shielding film.

34. A semiconductor device according to claim 31, wherein the light-shielding film comprises aluminum.

35. A semiconductor device according to claim 31, wherein the interlayer-insulating film comprises at least one selected from the group consisting of a polyimide film, an acrylic film, a polyamide film, a BCB (benzocyclobutene) film, and a MSSQ (methyl silsesquioxane) film.

36. A semiconductor device according to claim 31, wherein the semiconductor device is an EL display device.

37. A semiconductor device according to claim 31, wherein the semiconductor device is at least one selected from the group consisting of a portable telephone, a video camera, a personal computer, a goggle-type display, a projector, an electronic play machine, a picture reproducing apparatus, and a digital camera.

38. A semiconductor device according to claim 31, further comprising a capacitor in a portion where the light-shielding film and the electrically conducting film are overlapped.

39. A semiconductor device according to claim 31, wherein the electrically conducting film is transparent.

40. A semiconductor device according to claim 31, wherein the electrically conducting film is connected to the light-shielding film through an insulating film.

41. A semiconductor device comprising:
   a thin film transistor over a substrate, the thin film transistor comprising a semiconductor layer and a gate electrode with a gate insulating film interposed therebetween;
   a source electrode and a drain electrode electrically connected to the semiconductor layer;
   a pixel electrode electrically connected to one of the source electrode and the drain electrode;
   an interlayer-insulating film covering the tin film transistor, the source electrode and the drain electrode;
   a light-shielding film formed on the interlayer-insulating film; and
   a common feeder line electrically connected to the light-shielding film through an electrically conducting film,
   wherein the electrically conducting film is wider than the common feeder line in a lateral direction,
   wherein the common feeder line is not connected to the pixel electrode, and
   wherein the light-shielding film and the common feeder line are not overlapped with each other.

42. A semiconductor device according to claim 41, further comprising an insulating film between the light-shielding film and the electrically conducting film.

43. A semiconductor device according to claim 41, wherein the pixel electrode formed over the light-shielding film.

44. A semiconductor device according to claim 41, wherein the light-shielding film comprises aluminum.

45. A semiconductor device according to claim 41, wherein the interlayer-insulating film comprises at least one selected from the group consisting of a polyimide film, an acrylic film, a polyamide film, a BCB (benzocyclobutene) film, and a MSSQ (methyl silsesquioxane) film.

46. A semiconductor device according to claim 41, wherein the semiconductor device is an EL display device.

47. A semiconductor device according to claim 41, wherein the semiconductor device is at least one selected from the group consisting of a portable telephone, a video camera, a personal computer, a goggle-type display, a projector, an electronic play machine, a picture reproducing apparatus, and a digital camera.

48. A semiconductor device according to claim 41, further comprising a capacitor in a portion where the light-shielding film and the electrically conducting film are overlapped.

49. A semiconductor device according to claim 41, wherein the electrically conducting film is transparent.

50. A semiconductor device according to claim 41, wherein the electrically conducting film is connected to the light-shielding film through an insulating film.

51. A semiconductor device comprising:
   a thin film transistor over a substrate, the thin film transistor comprising a semiconductor layer and a gate electrode with a gate insulating film interposed therebetween;
   a source electrode and a drain electrode electrically connected to the semiconductor layer,
   a pixel electrode electrically connected to one of the source electrode and the drain electrode;
   an interlayer-insulating film covering the thin film transistor;
   a light-shielding film formed over the interlayer-insulating film; and
   a common feeder line electrically connected to the light-shielding film through an electrically conducting film,
   wherein the electrically conducting film is wider than the common feeder line in a lateral direction, and
   wherein the light-shielding film and the common feeder line are not overlapped with each other.

52. A semiconductor device according to claim 51, further comprising an insulating film between the light-shielding film and the electrically conducting film.

53. A semiconductor device according to claim 51, wherein the pixel electrode formed over the light-shielding film.

54. A semiconductor device according to claim 51, wherein the light-shielding film comprises aluminum.

55. A semiconductor device according to claim 51, wherein the interlayer-insulating film comprises at least one selected from the group consisting of a polyimide film, an acrylic film, a polyamide film, a BCB (benzocyclobutene) film, and a MSSQ (methyl silsesquioxane) film.

56. A semiconductor device according to claim 51, wherein the semiconductor device is an EL display device.

57. A semiconductor device according to claim 51, wherein the semiconductor device is at least one selected from the group consisting of a portable telephone, a video camera, a personal computer, a goggle-type display, a projector, an electronic play machine, a picture reproducing apparatus, and a digital camera.

58. A semiconductor device according to claim 51, further comprising a capacitor in a portion where the light-shielding film and the electrically conducting film are overlapped.

59. A semiconductor device according to claim 51, wherein the electrically conducting film is transparent.

60. A semiconductor device according to claim 51, wherein the electrically conducting film is connected to the light-shielding film through an insulating film.

* * * * *